(12) United States Patent
Lin

(10) Patent No.: US 9,525,126 B1
(45) Date of Patent: Dec. 20, 2016

(54) MAGNETIC TUNNEL JUNCTION AND 3-D MAGNETIC TUNNEL JUNCTION ARRAY

(71) Applicant: Yeu-Chung Lin, Hsin-Chu (TW)

(72) Inventor: Yeu-Chung Lin, Hsin-Chu (TW)

(*) Notice: Subject to any disclaimer, the term of this patent is extended or adjusted under 35 U.S.C. 154(b) by 0 days.

(21) Appl. No.: 14/846,960

(22) Filed: Sep. 7, 2015

(51) Int. Cl.
*H01L 43/02* (2006.01)
*H01L 43/08* (2006.01)
*H01L 27/22* (2006.01)

(52) U.S. Cl.
CPC ............ *H01L 43/02* (2013.01); *H01L 27/222* (2013.01); *H01L 43/08* (2013.01)

(58) Field of Classification Search
CPC ......... H01L 43/02; H01L 43/08; H01L 27/222
See application file for complete search history.

(56) References Cited

U.S. PATENT DOCUMENTS

| 2010/0193888 | A1* | 8/2010 | Gu  | H01L 43/08 257/421 |
| 2013/0140657 | A1* | 6/2013 | Lee | H01L 27/228 257/421 |
| 2015/0021675 | A1* | 1/2015 | Min | H01L 43/08 257/295 |

* cited by examiner

*Primary Examiner* — Minh-Loan Tran
*Assistant Examiner* — Farid Khan
(74) *Attorney, Agent, or Firm* — Alan D. Kamrath; Kamrath IP Lawfirm, P.A.

(57) ABSTRACT

A magnetic tunnel junction cell includes a first electrode having an axis extending in a direction substantially perpendicular to an active surface of a substrate. The magnetic tunnel junction further includes a fixed layer, a U-shaped free layer, a tunnel layer sandwiched between the fixed layer and the U-shaped free layer and a second electrode embedded in the U-shaped free layer. The fixed layer, the tunnel layer and the U-shaped free layer are disposed between the first electrode and the second electrode and constitute a magnetic tunnel junction. The tunnel layer may also be U-shaped.

13 Claims, 22 Drawing Sheets

MAGNETIC TUNNEL JUNCTION AND 3-D MAGNETIC TUNNEL JUNCTION ARRAY

FIELD OF THE DISCLOSURE

The present invention relates to an electronic device which enables a 3-D magnetic tunnel junction array comprising a plurality of magnetic tunnel junctions stacked vertically.

BACKGROUND OF THE INVENTION

Tunnel magnetoresistance (TMR) effect was discovered in 1975. This effect was observed in a magnetic tunnel junction consisting of two ferromagnets and a tunnel barrier sandwiched between the two ferromagnets. Since then, magnetic tunnel junctions have been studied and developed for different electronic applications. Two important applications based on magnetic tunnel junctions among others are the read-heads of hard disk drives and a new type of non-volatile memory MRAM (magnetic random access memory). In order to satisfy exponentially increased demand of high storage capacity and low cost, industry usually tends to shrink the line width, pitch and film thickness (technology node in general) within electronic devices, thereby increasing device density in a single chip and reducing the cost per chip. However, when the shrinkage is approaching physical limits, the industry faces a dilemma. What's needed is a new design that can increase device density while keeping the chip size and technology node.

SUMMARY OF THE INVENTION

In order to increase device density while keep the chip size, the present invention provides various kinds of methods, cells and arrays.

In order to accomplish the above object, an aspect of the present invention provides an electronic device comprising a first electrode, a fixed layer, a U-shaped free layer, a tunnel layer sandwiched between the fixed layer and the U-shaped free layer, and a second electrode embedded in the U-shaped free layer. The first electrode has an axis extending in a direction substantially perpendicular to an active surface of a substrate. The fixed layer, the tunnel layer and the U-shaped free layer are disposed between the first electrode and the second electrode and constitute a magnetic tunnel junction.

According to an embodiment, the U-shaped free layer has a vertical portion extending substantially in a direction perpendicular to the active surface and directions of magnetizations of the vertical portion and the fixed layer may be substantially parallel to or perpendicular to the active surface.

According to an embodiment, the electronic device further comprises a through hole on the substrate with an inner surface of the through hole lined with the fixed layer and the tunnel layer and the through hole filled with the first electrode and a trench substantially perpendicular to the active surface with a recess and another recess protruding from the trench along different horizontal levels. The U-shaped free layer lines an inner surface of the recess and another U-shaped free layer lines an inner surface of the another recess. Another second electrode is embedded in the another U-shaped free layer. The fixed layer, the tunnel layer, the U-shaped free layer and the another U-shaped free layer constitute a plurality of magnetic tunnel junctions stacked vertically.

In order to accomplish the above object, another aspect of the present invention provides an electronic device comprising a first electrode, a fixed layer, a U-shaped free layer, a U-shaped tunnel layer sandwiched between the fixed layer and the U-shaped free layer, and a second electrode embedded in the U-shaped free layer. The first electrode has an axis extending in a direction substantially perpendicular to an active surface of a substrate. The fixed layer, the U-shaped tunnel layer and the U-shaped free layer are disposed between the first electrode and the second electrode and constitute a magnetic tunnel junction.

According to an embodiment, the U-shaped free layer has a vertical portion extending substantially in a direction perpendicular to the active surface and directions of magnetizations of the vertical portion and the fixed layer may be substantially parallel to or perpendicular to the active surface.

According to an embodiment, the electronic device further comprises a through hole on the substrate with an inner surface of the through hole lined with the fixed layer and the through hole filled with the first electrode and a trench substantially perpendicular to the active surface with a recess and another recess protruding from the trench along different horizontal levels. The U-shaped tunnel layer and the U-shaped free layer line an inner surface of the recess and another U-shaped tunnel layer and another U-shaped free layer line an inner surface of the another recess. Another second electrode is embedded in the another U-shaped free layer. The fixed layer, the U-shaped tunnel layer, the U-shaped free layer, the another U-shaped tunnel layer and the another U-shaped free layer constitute a plurality of magnetic tunnel junctions stacked vertically.

In order to accomplish the above object, yet another aspect of the present invention provides a three-dimensional magnetic tunnel junction array comprising a first electrode, a first fixed layer, a first free layer, a first tunnel layer sandwiched between the first fixed layer and the first free layer, a first second electrode, a second fixed layer, a second free layer, a second tunnel layer sandwiched between the second fixed layer and the second free layer and a second electrode. The first electrode has an axis extending in a direction substantially perpendicular to an active surface of a substrate. The first fixed layer, the first tunnel layer and the first free layer disposed between the first electrode and the first second electrode constitute a first magnetic tunnel junction. The second fixed layer, the second tunnel layer and the second free layer disposed between the first electrode and the second electrode constitute a second magnetic tunnel junction. The first magnetic tunnel junction and the second magnetic tunnel junction are stacked vertically along the first electrode.

According to an embodiment, the three-dimensional magnetic tunnel junction array further comprises a through hole on the substrate. An inner surface of the through hole is lined with a fixed layer and a tunnel layer and the through hole is filled with the first electrode. The first fixed layer and the second fixed layer are portions of the fixed layer. The first tunnel layer and the second tunnel layer are portions of the tunnel layer.

According to an embodiment, the three-dimensional magnetic tunnel junction array further comprises a trench on the substrate and a first recess and a second recess protruding from the trench along different horizontal levels. The first free layer and the first tunnel layer are both U-shaped and line an inner surface of the first recess. The second free layer and the second tunnel layer are both U-shaped and line an inner surface of the second recess.

BRIEF DESCRIPTION OF THE DRAWINGS

FIGS. 1, 2B, 3B, 4B, 5B, 6B, 7B and 8 are cross-sectional views taken along cutting line A-A' in the top views of FIGS. 11-16 illustrating a method for fabricating a 3D MTJ array according to the second embodiment of the present invention, wherein forming second electrodes is performed before forming first electrodes.

FIG. 8 is a cross-sectional view of a 3D MTJ array according to an embodiment of the present invention.

DESCRIPTION OF THE PREFERRED EMBODIMENTS

The following descriptions illustrate embodiments of the present invention in detail. All the components, sub-portions, structures, materials and arrangements therein can be arbitrarily combined in any sequence despite their belonging to different embodiments and having different sequence originally. All these combinations are considered to fall into the scope of the present invention which is defined by the appended claims.

There are a lot of embodiments and figures within this application. To avoid confusions, similar components are designated by the same or similar numbers. To simplify figures, repetitive components are only marked once. Furthermore, in the detailed top views or cross-sectional views only a partial layout is shown for illustration but a person skilled in the art can understand a complete layout may comprise a plurality of the partial layouts and more.

All the magnetic tunnel junctions (MTJs), magnetic tunnel junction cells (MTJ cells) and three-dimensional magnetic tunnel junction arrays (3D MTJ arrays) discussed in the present application, either alone or together with other electronic elements such as transistor, resistor, capacitor and circuitry of different functions, are deemed as electronic devices. Either their singular form, plural form and/or a combination with other electronic elements fall within the scope of the present invention.

Figure 11:
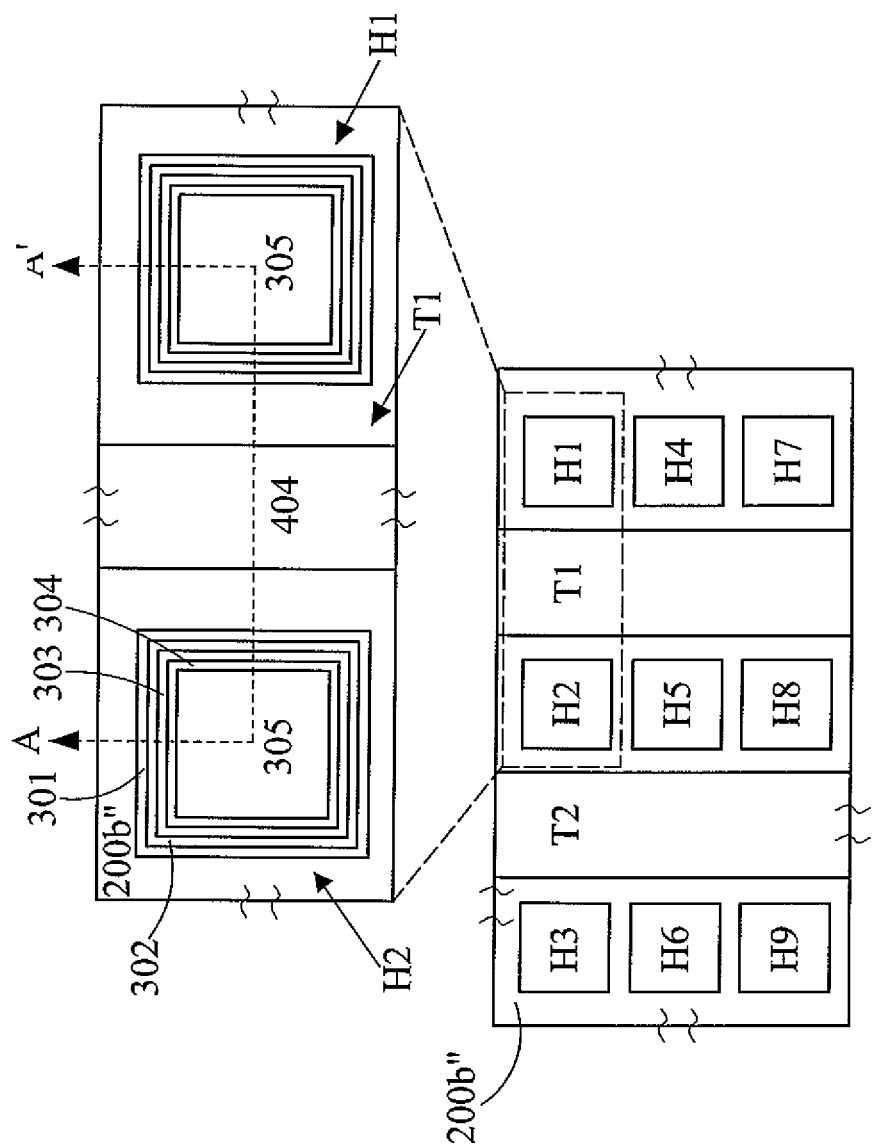
FIGS. 11-12 are schematic top views of the 3D MTJ array taken along different horizontal levels in the FIG. 8 according to an embodiment of the present invention.
Figure 12:
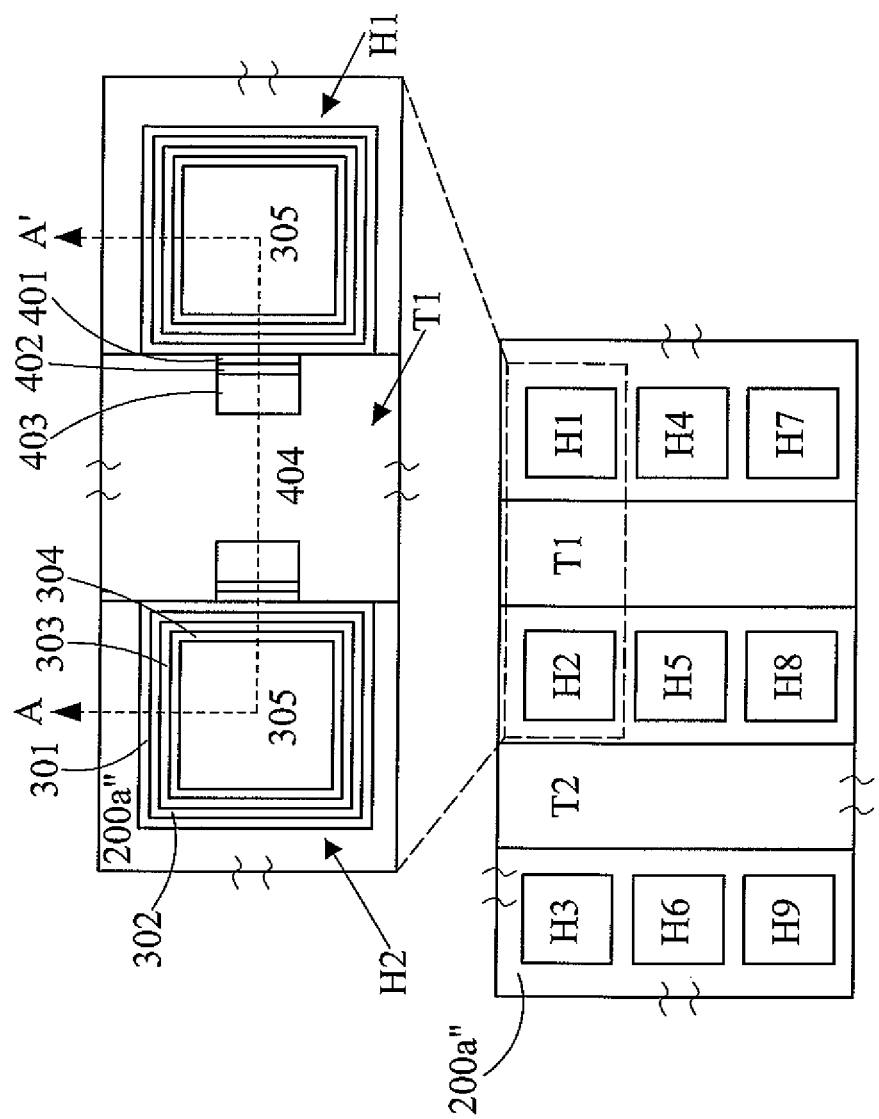
Figure 13:
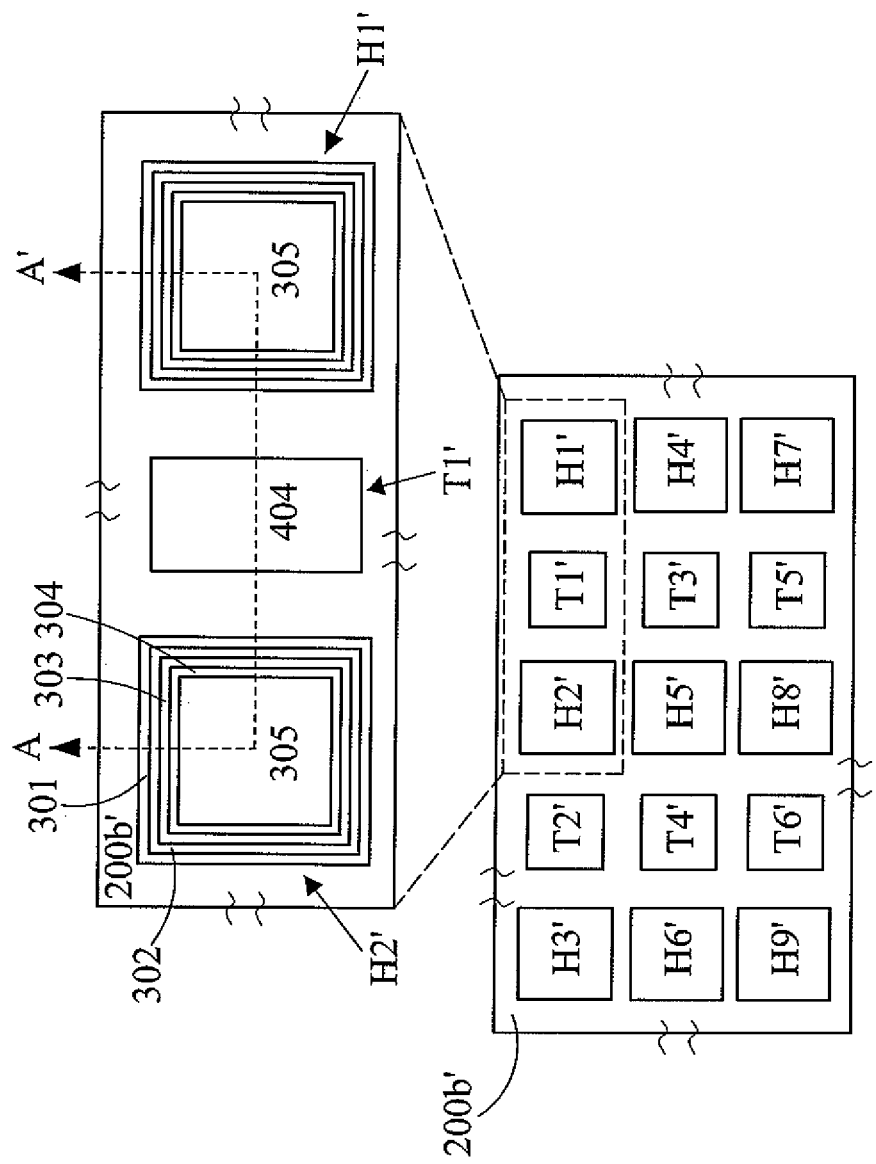
FIG. 13-14 are schematic top views of the 3D MTJ array taken along different horizontal levels in the FIG. 8 according to another embodiment of the present invention.
Figure 14:
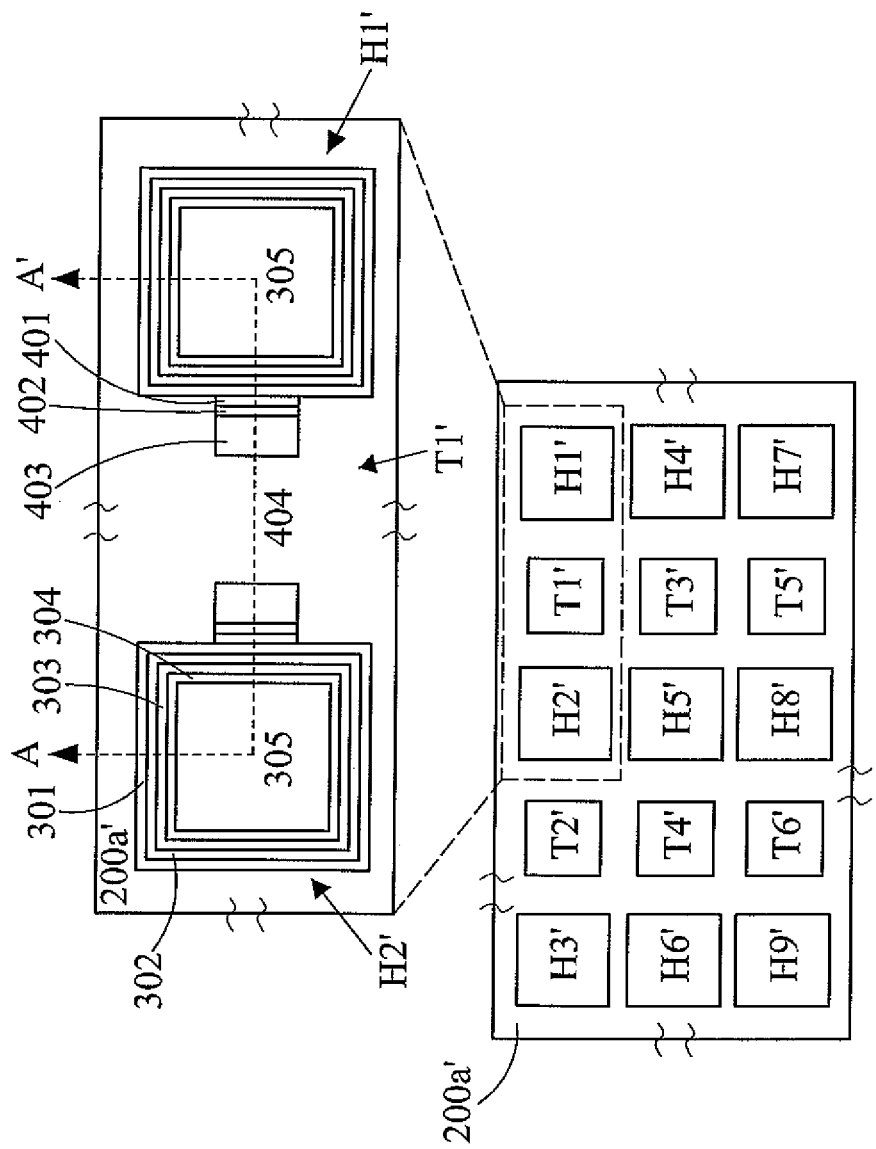
Figure 15:
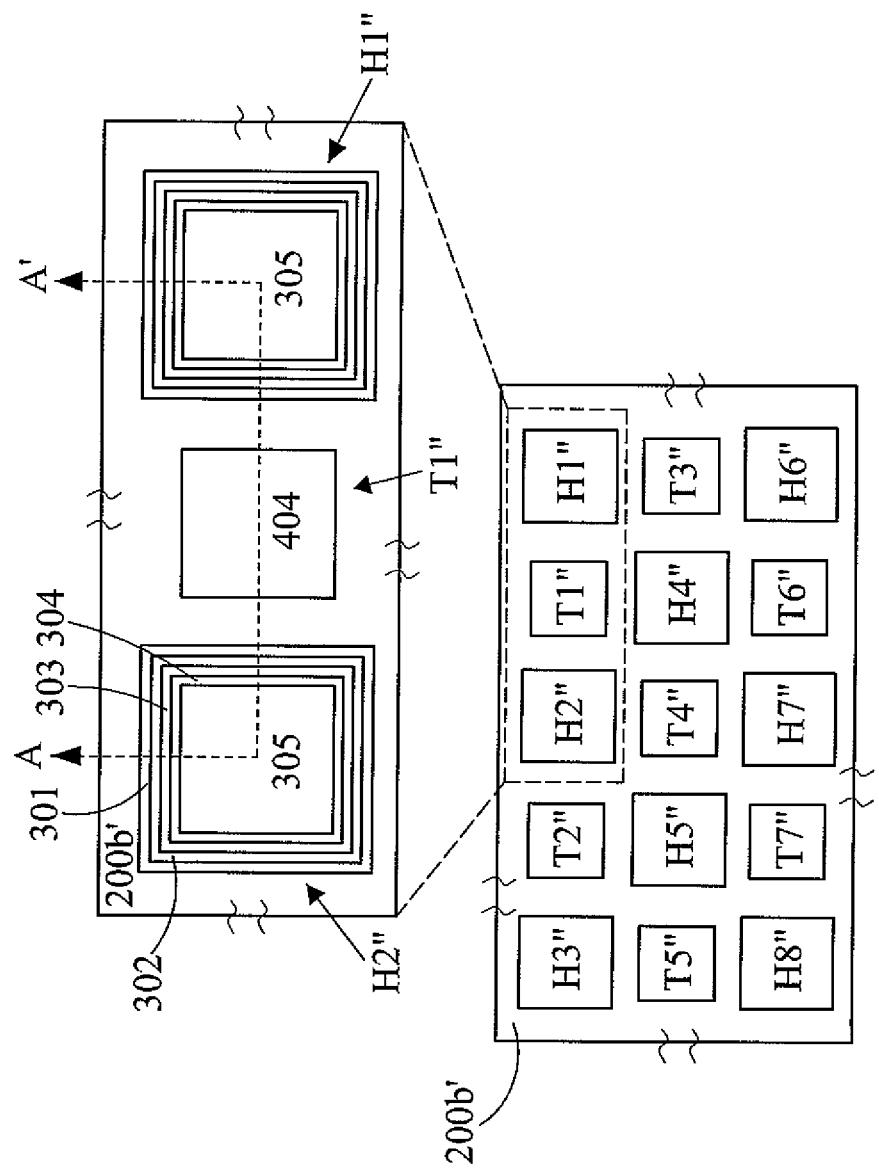
FIG. 15-16 are schematic top views of the 3D MTJ array taken along different horizontal levels in the FIG. 8 according to yet another embodiment of the present invention.
Figure 16:
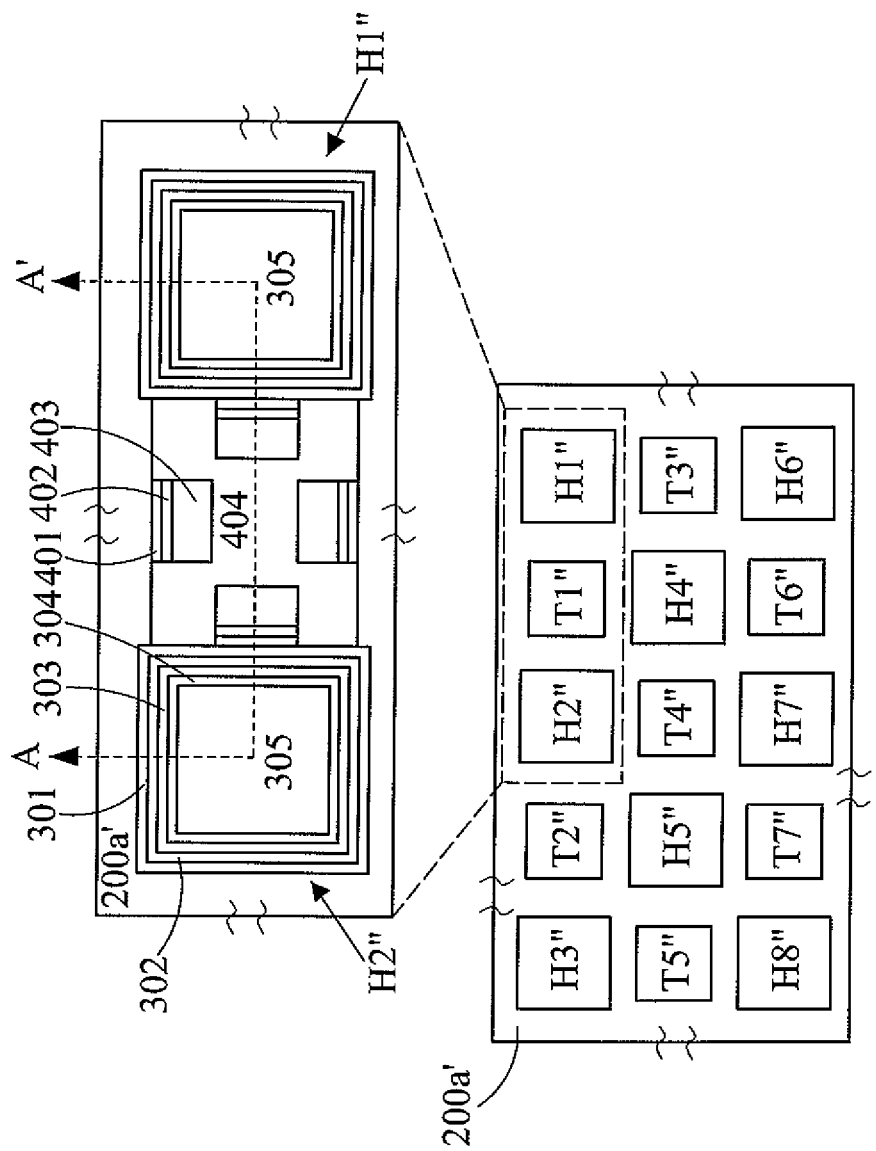

Now the first embodiment of the present invention is discussed in conjunction with FIGS. 1, 2A, 3A, 4A, 5A, 6A, 7A and 8 and FIGS. 11-16. FIGS. 1, 2A, 3A, 4A, 5A, 6A, 7A and 8 are cross-sectional views taken along cutting line A-A' in the top views of FIGS. 11-16 illustrating a method for fabricating a 3D MTJ array according to the first embodiment of the present invention, wherein forming first electrodes is performed before forming second electrodes. FIGS. 11-12 are schematic top views of the 3D MTJ array taken along different horizontal levels in the FIG. 8 according to an embodiment of the present invention. FIG. 13-14 are schematic top views of the 3D MTJ array taken along different horizontal levels in the FIG. 8 according to another embodiment of the present invention. FIG. 15-16 are schematic top views of the 3D MTJ array taken along different horizontal levels in the FIG. 8 according to yet another embodiment of the present invention.

Figure 1:
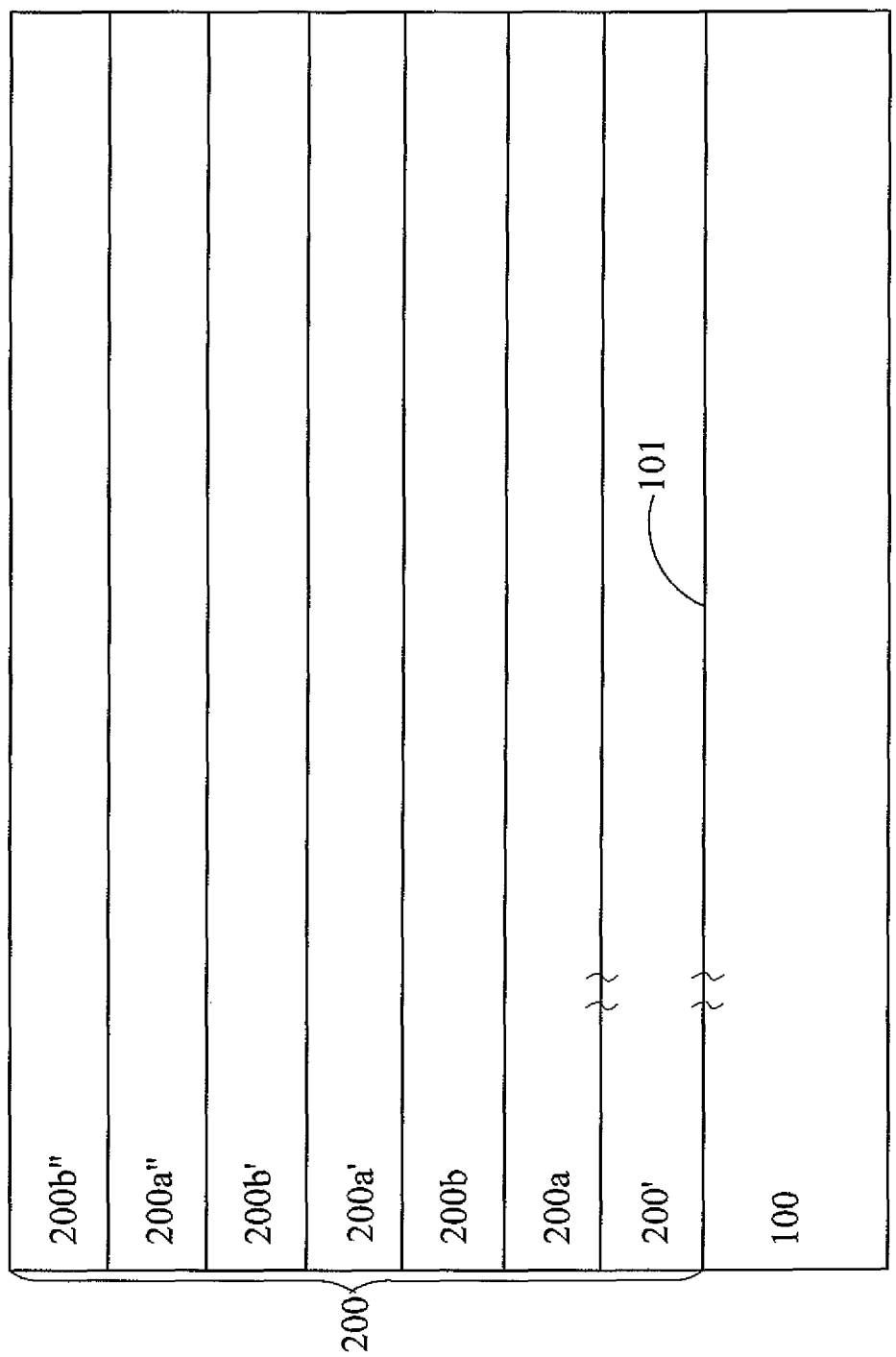
FIGS. 1, 2A, 3A, 4A, 5A, 6A, 7A and 8 are cross-sectional views taken along cutting line A-A' in the top views of FIGS. 11-16 illustrating a method for fabricating a three-dimensional magnetic tunnel junction array (3D MTJ array) according to the first embodiment of the present invention, wherein forming first electrodes is performed before forming second electrodes.

First referring to FIG. 1, a substrate 100 with an active surface 101 is provided. In one embodiment, the substrate 100 is a single-crystal Si substrate. In various embodiments, the substrate 100 may be a silicon-on-insulation (SOI) wafer or a partially fabricated wafer during any of many stages of integrated circuit fabrication thereon. A plurality of bilayers 200', (200a, 200b), (200a', 200b') and (200a", 200b") are formed on the active surface 101 along different horizontal levels substantially parallel to the active surface 101. The layer 200' represents additional sets of bilayer 200a and 200b selectively provided. The layers (200a, 200a' and 200a") use a first dielectric material which is different from a second dielectric material used by the layers (200b, 200b' and 200"), so the layers (200a, 200a' and 200a") are also referred to as the first dielectric layers (200a, 200a' and 200a") while the layers (200b, 200b' and 200b") are also referred to as the second dielectric layers (200b, 200b' and 200b"). The term "different" used here indicates the same material with/without dopants, the same material with/without porosity, the same material with different crystalline orientations, or different materials. In one embodiment, the alternating first dielectric layers (200a, 200a' and 200a") and the second dielectric layers (200b, 200b' and 200b") have high etching selectivity under the same etching condition such as the same etchant (etchants) and the same pressure and/or RF power. For example, the first dielectric layer may comprise an oxide-based material such as silicon dioxide (SiO2), spin-on glass (SOG), silicon oxide made by tetraethyl organic silicate (TEOS), oxygen-rich silicon oxide or a combination thereof while the second dielectric layer may comprise a nitride-based or carbide-based material such as silicon nitride (SiN), silicon oxynitride (SiON), silicon carbide (SiC), silicon oxycarbide (SiOC), silicon carbide nitride (SiCN), or a combination thereof. For example, the first dielectric layer may comprise a low-k (low dielectric constant) material such as Black Dimond™, SiLK™, SiOC, or a combination thereof while the second dielectric material may comprise another low-k material. The term "low-k" used here indicates a dielectric constant lower than the dielectric constant of silicon dioxide such as lower than 3.9. Generally, the second dielectric material used for the second dielectric layers (200b, 200b' and 200") should be chosen considering its dielectric constant k, adhesion ability, structural strength and potential to be etched by a wet etchant. In an embodiment, each of the first dielectric layers (200a, 200a' and 200a") and each of the second dielectric layers (200b, 200b' and 200") have the same as-formed thickness. In another embodiment, the first dielectric layers (200a, 200a' and 200a") each has a first as-formed thickness and the second dielectric layers (200b, 200b' and 200") each has a second as-formed thickness, wherein the first as-formed thickness is different from the second as-formed thickness. The term "as formed thickness" used here indicates a thickness measured immediately after formation which may be different from a thickness measured after a treatment performed on the formed dielectric layer such as a UV curing, a thermal treatment, a wet cleaning, an oxidation process, a nitridation process and/or a plasma treatment and/or a further process such as an etching process and/or a polishing process. Furthermore, the present invention is not limited to iterations of the first dielectric layer and the second dielectric layer but comprises iterations of a film stack containing at least the first dielectric layer and the second dielectric layer. For example, iterations of the first dielectric layer, the second dielectric layer and a third dielectric layer fall in the scope of the present invention. For example, the second dielectric layer may comprise multiple dielectric layers of different properties and/or functions.

Figure 2A:
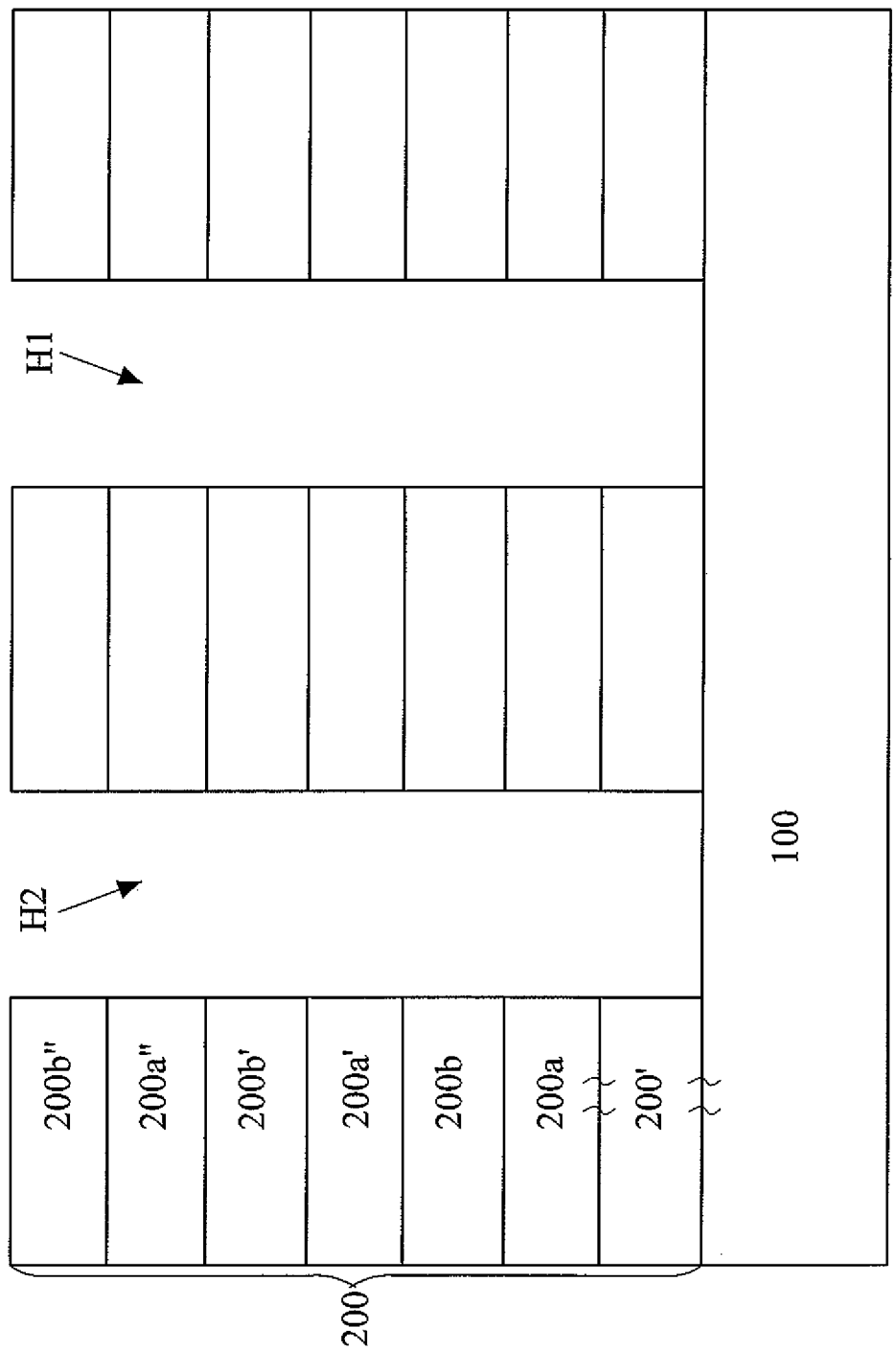

Then referring to FIG. 2A and FIG. 11, a plurality of through holes H1-Hn (only H1-H9 are shown in the partial layout top view of FIG. 11 and only H1 and H2 are shown in the partial cross-sectional view of FIG. 2A) are formed penetrating the bilayers 200', (200a, 200b), (200a', 200b') and (200a"+200b") and exposing the substrate 100 by at least a dry etching process especially an anisotropic dry etching process. The number n is an integer indicating the quantity of through holes formed. The through holes H1-Hn extend along their axis direction substantially perpendicular to the active surface 101 of the substrate 100 and may have for example rectangular shapes in top view as shown in FIG. 11 (will be discussed in detail later in view of FIGS. 11-16). It is noted that the inner surfaces of the through holes H1-Hn may not be smoothed and perpendicular to the active surface 101 as shown in FIG. 2A due to process deviations. For example, the inner surfaces of the through holes H1-Hn may be jagged due to slightly different etching rates of the first and second dielectric materials. For example, the inner surfaces of the through holes H1-Hn may be scalloped due to specific etching recipe used for the high aspect ratio of the through holes H1-Hn. For example, the inner surfaces of the through holes H1-Hn may not be perpendicular to the active surface 101 due to tapered profile caused by etching. However, in a preferred embodiment, the etching conditions used to formed the through holes H1-Hn are so chosen that the inner surfaces of the through holes H1-Hn are at least smoothed and continuous at the boundaries between the first dielectric layers (200a, 200a' and 200a") and the second dielectric layers (200b, 200b' and 200b"). It is also noted that the actual shapes of the through holes H1-Hn in top view obtained after photolithography and etching processes may not be perfect rectangles due to optical effects and/or other factors. For example, the through holes H1-Hn in top view rather have corner-rounded shapes.

Figure 3A:
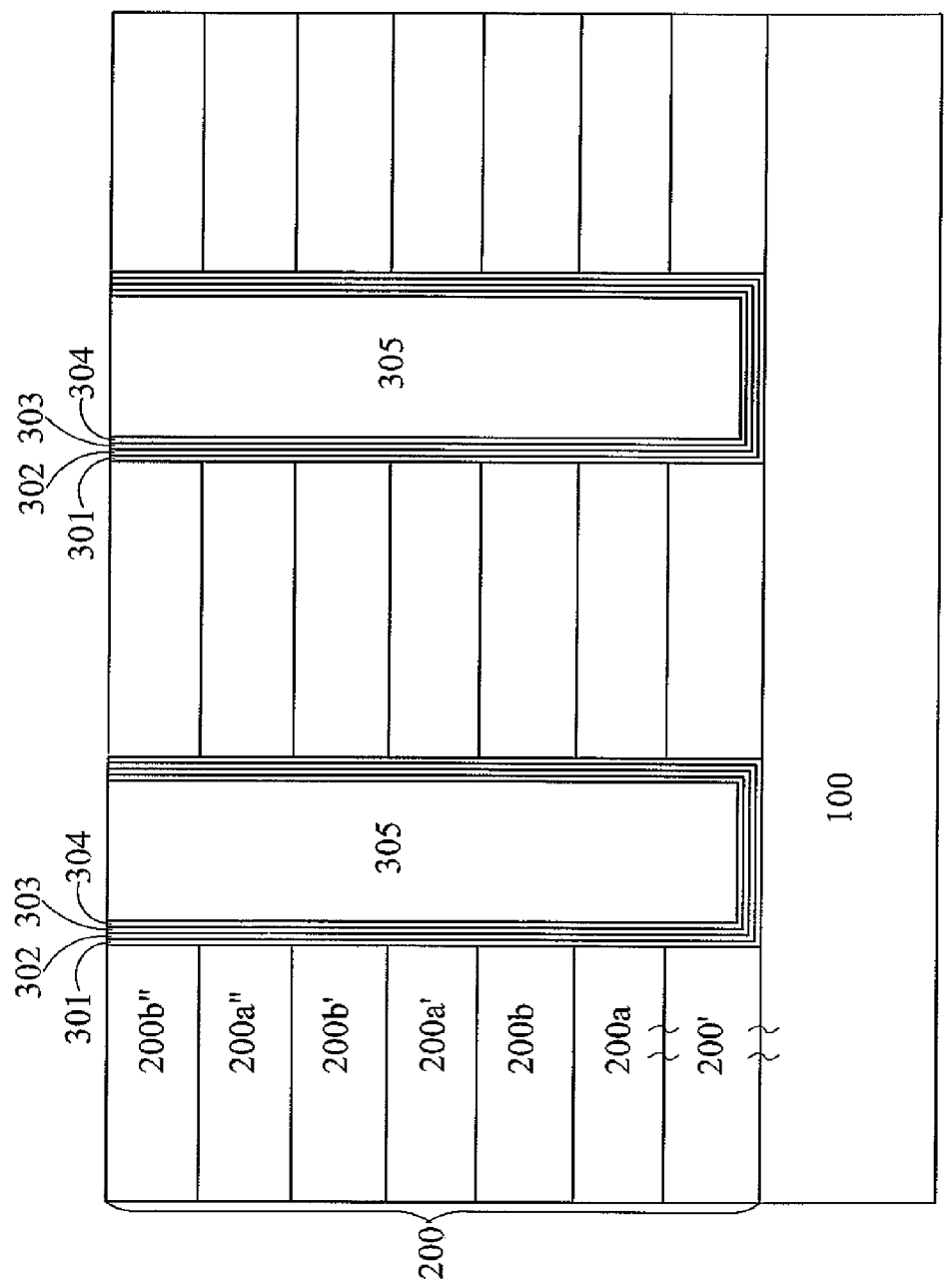

Next referring to FIG. 3A and FIG. 11, a tunnel layer 301, a fixed layer 302, an optional antiferromagnetic layer (AFM layer) 303 and an optional buffer layer 304 are formed in such order lining the through holes H1-Hn. The tunnel layer 301 may comprise magnesium oxide (MgO), aluminum oxide ($Al_2O_3$), or any material which can serve the purpose of tunnel layer in an MTJ. The tunnel layer 301 should be a thin uniform layer with a thickness ranging from a few angstroms to a few nanometers. Since the tunneling resistance of a MTJ cell is dominated by the quality and thickness of the tunnel layer, the tunnel layer 301 should have an extremely uniform thickness throughout the whole substrate 100 and within each one of the through holes H1-Hn and should be free of pinholes and bumps in order to achieve a MTJ array constituted of a plurality of MTJ cells with minimum variations in resistance. The fixed layer 302 may comprise a ferromagnetic material such as cobalt-iron-boron (CoFeB), cobalt-iron-tantalum (CoFeTa), nickel-iron (NiFe), cobalt (Co), cobalt-iron (CoFe), cobalt-platinum (CoPt), cobalt-palladium (CoPd), iron-platinum (FePt), the alloy of Ni, Co and Fe, or any ferromagnetic material which has high TMR and high magnetic anisotropy. The AFM layer 303 comprises an antiferromagnetic material such as a manganese (Mn)-containing material and is antiferromagnetically coupled with the fixed layer 302 to collectively achieve a fixed magnetization on the fixed layer while behaves nearly no net magnetic moment observed from distant location. The optional buffer layer 304 may comprise a non-magnetic material such as ruthenium (Tu) and/or tantalum (Ta) to serve as an adhesion layer (glue layer) and/or barrier layer between the AFM layer 303 and a later-formed first electrode (to be discussed later in view of FIG. 3A). The tunnel layer 301, the fixed layer 302, the optional AFM layer 303 and the optional buffer layer 304 may be formed by chemical vapor deposition process especially atomic layer deposition process or by physical vapor deposition process specifically planar magnetron sputtering process or ion-beam deposition process.

Referring to FIG. 3A and FIG. 11 again, a first conductive material is formed filling the through holes H1-Hn and at least one planarization process such as a chemical mechanical polishing process is performed to remove excessive tunnel layer 301, fixed layer 302, optional AFM layer 303, optional buffer layer 304 and the first conductive material outside the through holes H1-Hn, thereby achieving a global planar surface across the substrate 100 and patterned first electrodes 305 filled in the through holes H1-Hn. That is, the exposed upper surfaces of the tunnel layer 301, fixed layer 302, optional AFM layer 303, optional buffer layer 304 and the first electrodes 305 substantially flush with the upper surface of the second dielectric layer 200b". Due to an over polishing often performed during a chemical mechanical polishing process, the second dielectric layer 200b" may have a thickness loss after the chemical mechanical polishing process. In order to compensate the post-CMP thickness loss of the second dielectric layer 200b", the as-formed thickness of the second dielectric layer 200b" may be increased to a thickness greater than a thickness of the second dielectric layer 200b'. That is, the second dielectric layer 200b" may be thicker than the second dielectric layer 200b' hence thicker than layer 200b. The first conductive material may be a low-resistivity conductive material commonly used for interconnects of integrated circuits such as doped polysilicon, tungsten (W), aluminum (Al), copper (Cu), an alloy thereof, or a conductive material commonly used for electrodes of III-V devices or memory devices such as chromium-gold (CrAu) or aluminum-gold (AlAu). The first conductive material may be formed by an electrode plating process, a vacuum plating process or a chemical vapor deposition process. Due to the complicated film stack (301-305) to be removed, a multi-step chemical mechanical polishing process using different polishing conditions such as different slurries, different down forces and/or different pH values may be needed to achieve high throughput and uniform removal.

Figure 4A:
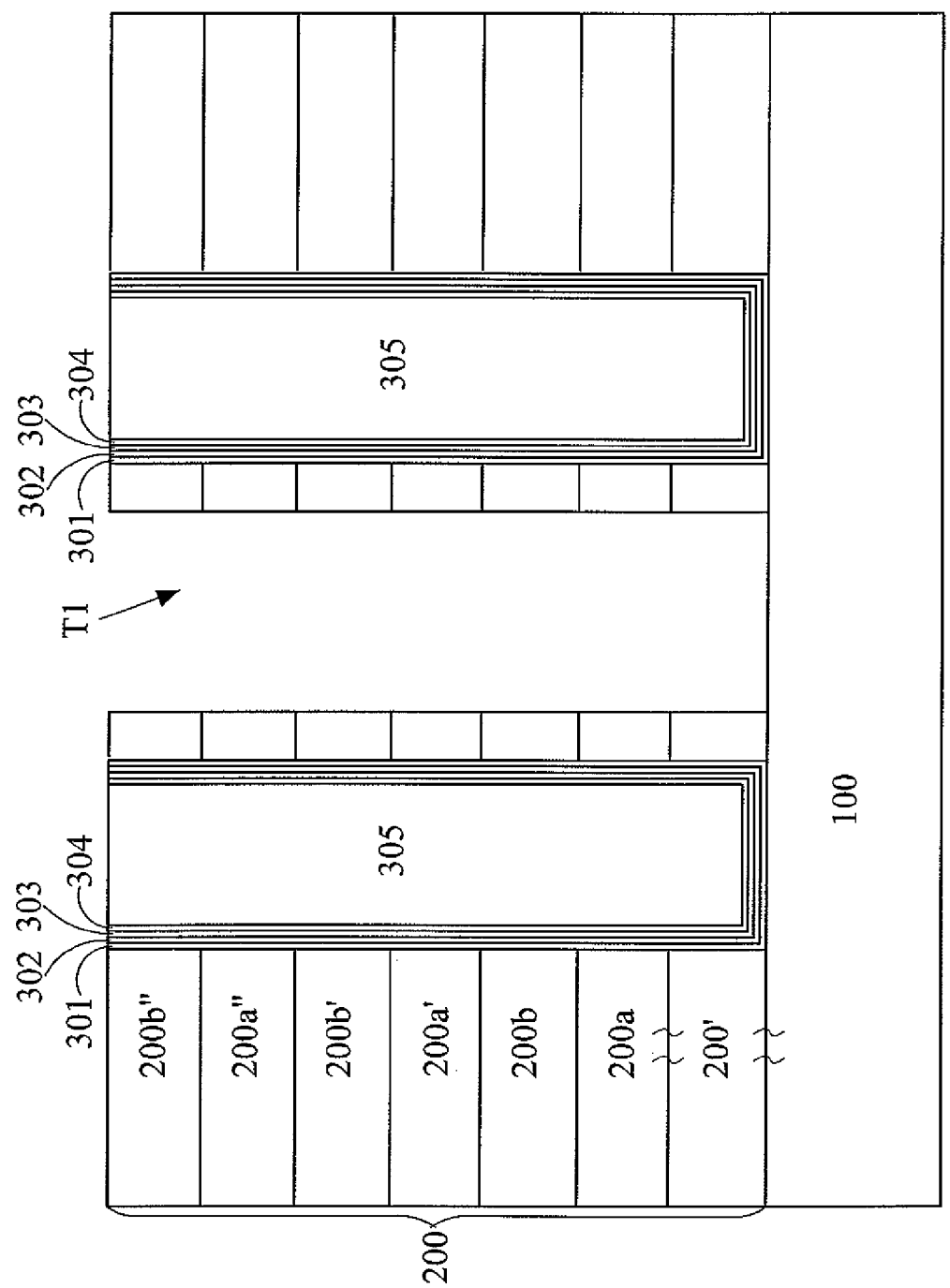

Next referring to FIG. 4A and FIG. 11, a plurality of trenches T1-Tm (only T1-T2 are shown in the partial layout top view of FIG. 11 and only one trench T1 is shown in FIG. 4A) are formed adjacent to the through holes, penetrating the bilayers 200', (200a, 200b), (200a', 200b') and (200a"+200b") and exposing the substrate 100 by at least a dry etching process especially an anisotropic dry etching process. The number m is an integer indicating the quantity of trenches formed and it may be the same as or different from the number n. The trenches T1-Tm extend along their axis direction substantially perpendicular to the active surface 101 of the substrate 100 and have for example rectangular shapes as shown in FIG. 11 in top view. The shapes of the trenches T1-Tm, in both top view and cross-sectional view, may suffer from similar process variations and factors mentioned in view of the through holes H1-Hn, resulting in imperfect sidewall profiles in cross-sectional view and shapes in top view.

Now referring to FIGS. 11-16, different partial layouts of trenches and through holes are provided. It is noted that cross-sectional views of these layouts taken along cutting line A-A' are the same. Furthermore, the layouts and structures shown FIGS. 11-16 may be fabricated by the same method i.e. the method illustrated by FIGS. 1, 2A, 3A, 4A, 5A, 6A, 7A and 8, or the method illustrated by FIGS. 1, 2B, 3B, 4B, 5B, 6B, 7B and 8 but with different photomasks for transferring corresponding layouts to material layers. The layouts of FIGS. 11-16 may also be fabricated by the method represented by FIG. 9 to obtain similar structures complying with the spirit and principle of the present invention. Therefore, unless otherwise specified, steps of the methods shared by these layouts will only be explained in regard to FIGS. 11-12 and should be construed to apply to all of these layouts. In an exemplary layout of the trenches and through holes, one trench may correspond to multiple through holes. For example, as shown in the partial layout of FIG. 11, a rectangular trench T1 may be sandwiched by two columns of through holes H1, H2, H4, H5, H7 and H8. The trenches and through holes may be arranged in other fashions. For example, as shown in FIG. 13, columns of trenches such as (T1', T3' and T5') and (T2', T4' and T6') and columns of through holes such as (H1', H4' and H7'), (H2', H5' and H8') and (H3', H6' and H9') are arranged alternatively. For example, as shown in FIG. 15, a rectangular trench T4" may be surrounded by at least four rectangular through holes H2", H4", H5" and H7". Each of the rectangular trenches T1'-Tq' (T1"-Tx", wherein q and x are integers) and each of the rectangular through holes H1'-Hr' (H1"-Hy", wherein r and y are integers) may be the same in their sizes such as areas in top view. Or as shown in FIG. 11, each of the rectangular trenches T1-Tm may be different from each of the rectangular through holes H1-Hn in their sizes. In the case of FIG. 4A and FIG. 11, one trench is smaller than a through hole. However, the present invention is not limited to the cases enumerated above and various combinations of trenches and through holes in view of their shapes, sizes, quantities and arrangements are feasible.

Figure 5A:
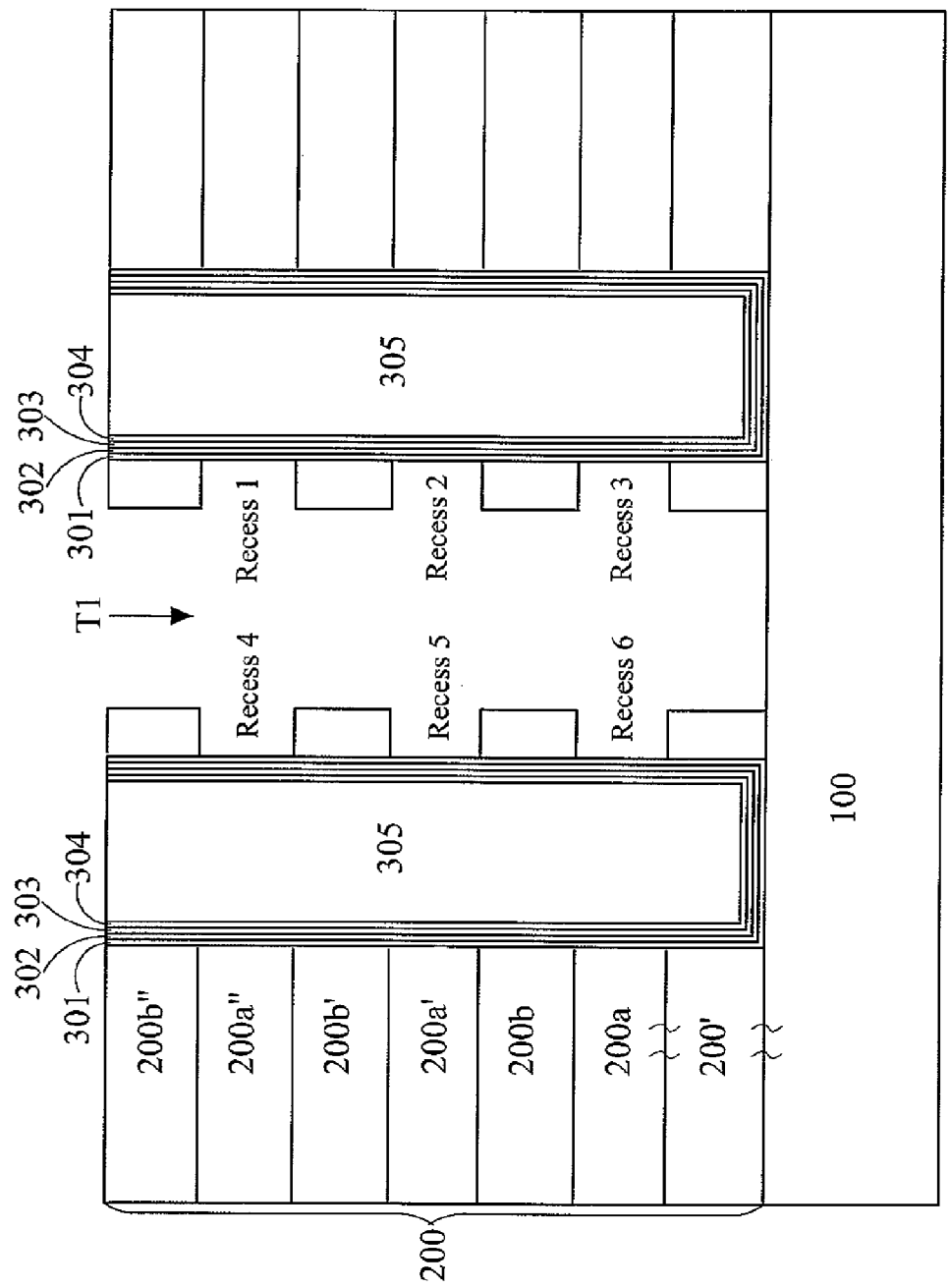

Next referring to FIG. 5A and FIGS. 11-16, at least an isotropic etching especially a wet etching is performed to selectively remove portions of the first dielectric layers (200a, 200a' and 200a") through the trenches T1-Tm (only one trench T1 is shown in FIG. 5A). In a preferred embodiment, this wet etching has high etching rate toward the first dielectric layers and extremely low etching rate toward the second dielectric layers (200b, 200b' and 200b"). As a result shown in FIG. 5A, Recesses 1-p (only Recesses 1-6 are shown in FIG. 5A) are formed in regions that otherwise would have been occupied by the first dielectric layers surrounding the trenches T1-Tm. The number p is an integer indicating the quantity of recesses formed. It is noted that the Recesses 1-6 may be shown as individual and separate recesses in the cross-sectional view of FIG. 5A but in the top views the Recesses 1, 2 and 3 are physically connected to the Recesses 4, 5 and 6 respectively (not shown). More specifically, the Recesses 1 and 4 are parts of a rectangular ring-shaped hollow to be filled later and surrounding the trench T1 in a top view taken along the level of the first dielectric layer 200a"; the Recesses 2 and 5 similarly are parts of a rectangular ring-shaped hollow (not shown, but could be seen in a top view taken along the level of the first dielectric layer 200a') to be filled later and surrounding the trench T1; and the Recesses 3 and 6 similarly are parts of a rectangular ring-shaped hollow (not shown, but could be seen in a top view taken along the level of the first dielectric layer 200a) to be filled later and surrounding the trench T1. The quantity of Recesses 1-p depends on the layout of the trenches and the through holes and how many sets of bilayers such as (200a, 200b) or (200a', 200b') or (200a", 200b") are formed. In the embodiment shown in FIGS. 11 and 12, one trench such as trench T1 is sandwiched by six through holes H1, H4, H7, H2, H5 and H8 (arranged in two columns), so a rectangular ring-shaped hollow (not shown) comprises six recesses. In the embodiment shown in FIGS. 13 and 14, one trench such as trench T3' is sandwiched by two through holes H4' and H5', so a rectangular ring-shaped hollow (not shown) in this case comprises two recesses. In the embodiment shown in FIGS. 15 and 16, one trench such as trench T4" is surrounded by four through holes H2", H4", H5" and H7", so a rectangular ring-shaped hollow in this case comprises four recesses. It is also noted that the shape of the hollow comprising multiple recesses depends on the shape of the trenches. A rectangular-shaped trench would lead to a rectangular shaped hollow. However, the hollow may not have perfect circular or rectangular shape due to different environments around the corresponding trench. One recess is defined between one trench and one through hole within a first dielectric layer. Therefore, the quantity of recesses formed within a hollow is determined by the quantity of through holes immediately adjacent to one trench. Furthermore, the Recesses 1, 2 and 3 expose three different areas of a surface of the tunnel layer 301 lining the through hole H1 while the Recesses 4, 5 and 6 expose three different areas of a surface of the tunnel layer 301 lining the through hole H2. The horizontal recess depth of each recess from a trench T1 depends on the distance between the trench and the through hole immediately adjacent to the trench. The vertical recess height of each recess depends on the thicknesses of the first dielectric layers (200a, 200a' and 200a"). In a preferred embodiment, the distance between the trench T1 and the through hole H1 is substantially equivalent to the distance between the trench T1 and the through hole H2. Similarly, in a preferred embodiment, the thicknesses of the first dielectric layers (200a, 200a' and 200a") in this stage should be substantially the same. The term "substantially" herein is used to cover the deviations from the desired results caused by unavoidable process margins/windows. For example, the distance between the trench T1 and the through hole H1 may not be equivalent to the distance between the trench T1 and the through hole H2 due to photolithography misalignment. For example, the thicknesses of the first dielectric layers (200a, 200a' and 200a") may not be the same due to deposition tool mismatch.

Figure 6A:
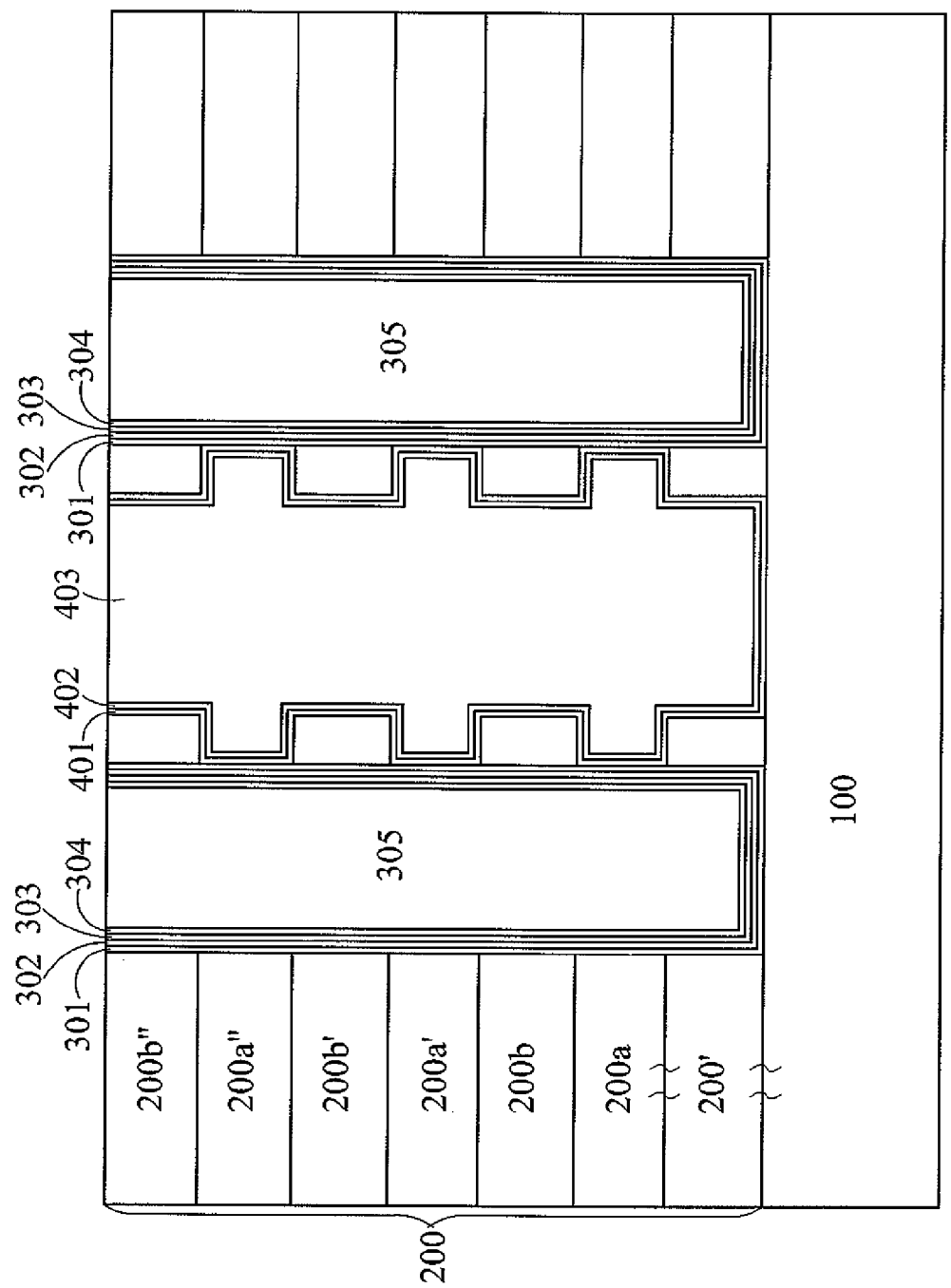
Figure 6B:
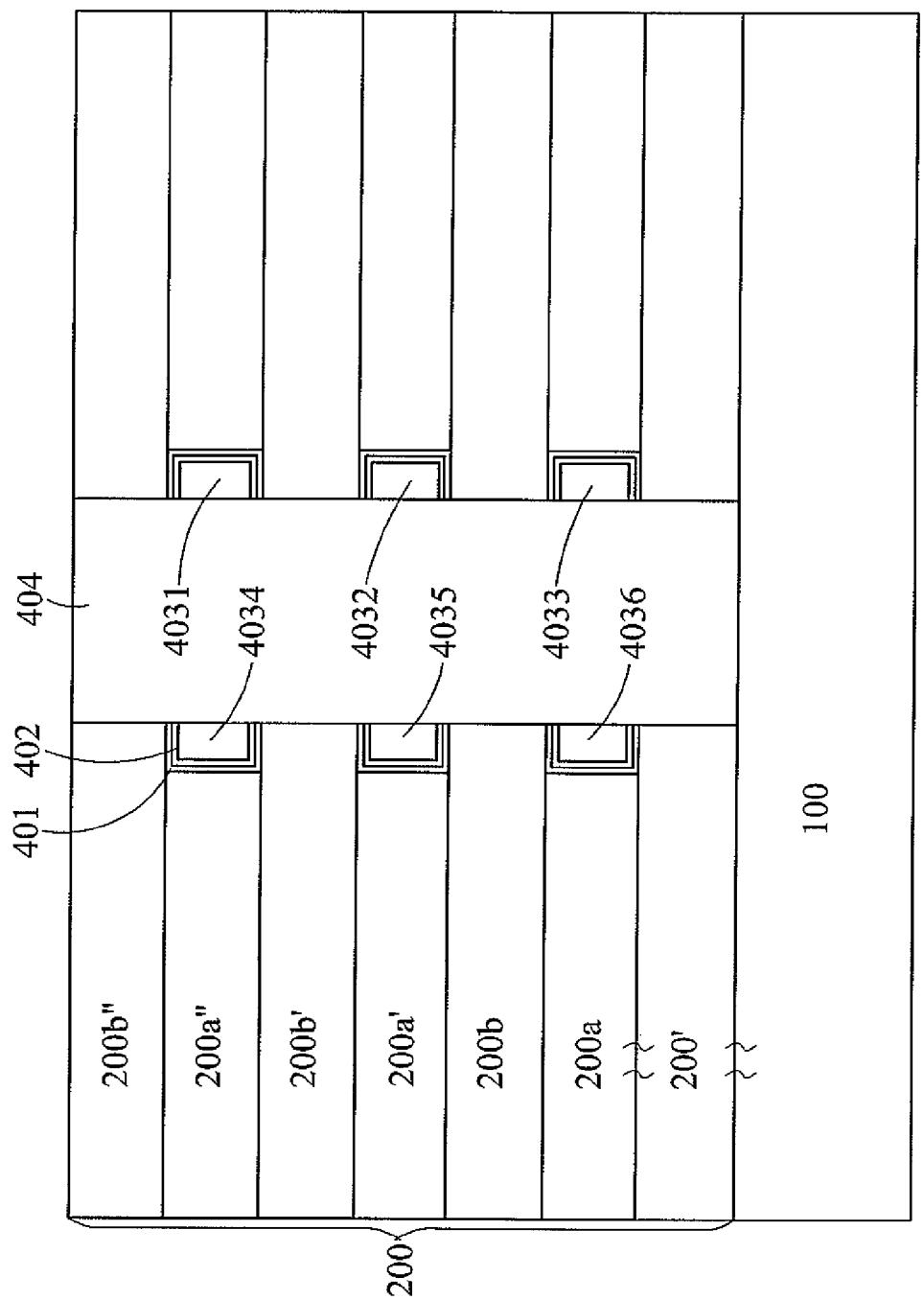

Next referring to FIG. 6A, a free layer 401 and an optional buffer layer 402 are formed in such order lining the inner surfaces of the trenches T1-Tm and the inner surfaces of the Recesses 1-p. Then, a second conductive material 403 is formed filling the trenches T1-Tm and the Recesses 1-p and at least one planarization process such as a chemical mechanical polishing process is performed to remove excessive free layer 401, optional buffer layer 402 and second conductive material 403 outside the trenches T1-Tm, thereby achieving a global planar surface across the substrate 100. That is, the polished upper surfaces of the tunnel layer 301, fixed layer 302, optional AFM layer 303, optional buffer layer 304 and the first electrodes 305 and the polished upper surfaces of the free layer 401, optional buffer layer 402 and second conductive material 403 are substantially flush with the polished upper surface of the second dielectric layer 200$b$". The free layer 401 may comprise a ferromagnetic material such as cobalt-iron-boron (CoFeB), cobalt-iron-tantalum (CoFeTa), nickel-iron (NiFe), cobalt (Co), cobalt-iron (CoFe), cobalt-platinum (CoPt), cobalt-palladium (CoPd), iron-platinum (FePt), or the alloy of Ni, Co and Fe, or any ferromagnetic material which has low coercivity and high thermal stability. The optional buffer layer 402 may comprise a non-magnetic material such as ruthenium (Tu) and/or tantalum (Ta) to serve as an adhesion layer (glue layer) and/or barrier layer between the free layer 401 and the second conductive material 403. The free layer 401 and the optional buffer layer 402 may be formed by chemical vapor deposition process especially atomic layer deposition process or physical vapor deposition process specifically planar magnetron sputtering process or ion-beam deposition process. The second conductive material may be a low-resistivity conductive material commonly used for interconnects of integrated circuits such as doped polysilicon, tungsten (W), aluminum (Al), copper (Cu) or an alloy thereof or a conductive material commonly used for electrodes of III-V devices or memory devices such as chromium-gold (CrAu) or aluminum-gold (AlAu). The second conductive material may be formed by an electrode plating process, a vacuum plating process or a chemical vapor deposition process. Due to the complicated film stack (401-403) to be removed, a multi-step chemical mechanical polishing process using different polishing conditions may be needed to achieve high throughput and uniform removal.

Figure 7A:
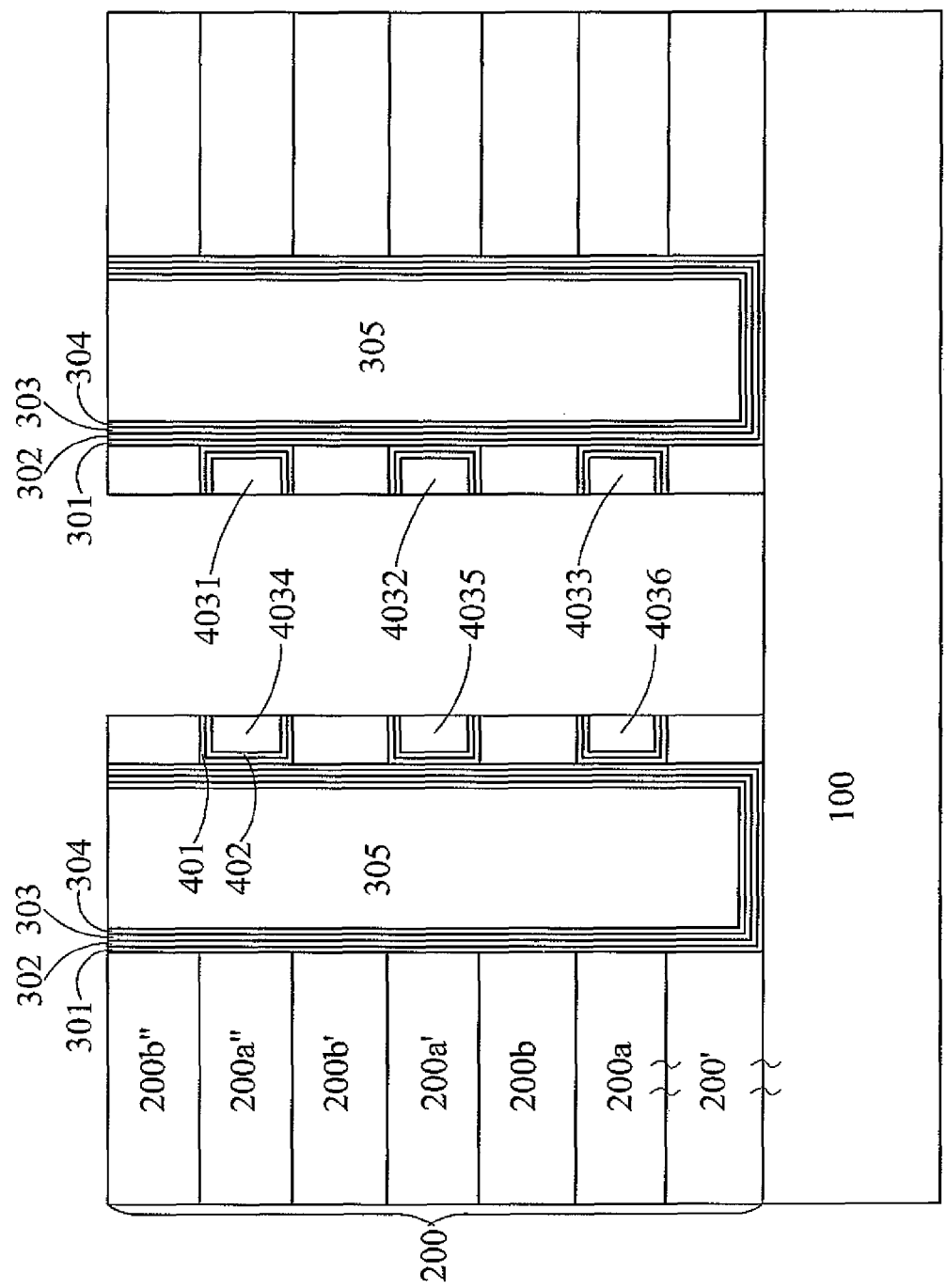
Figure 7B:
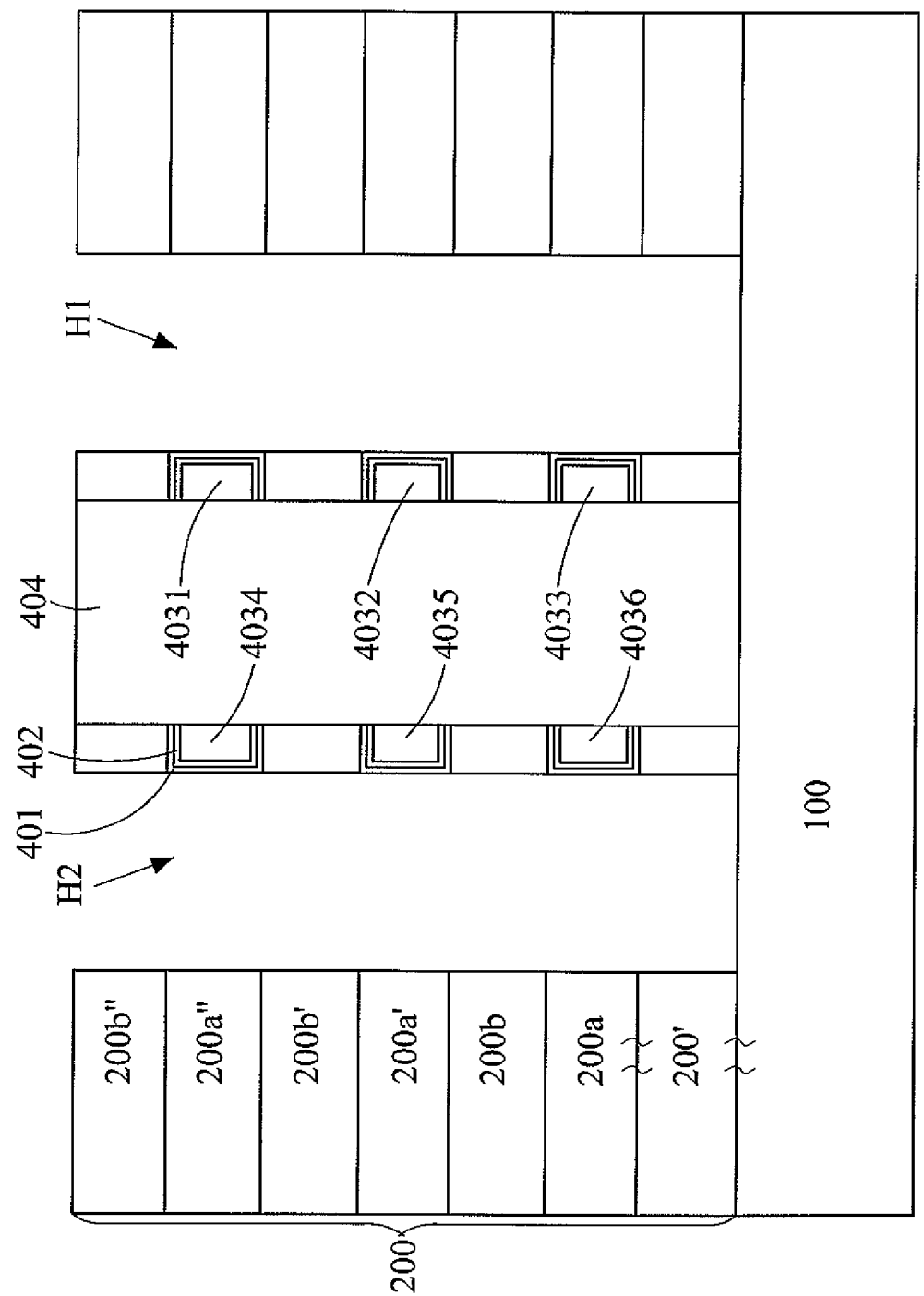

Then referring to FIG. 7A and FIGS. 11-16, at least one anisotropic etching is performed to remove portions of the second conductive material 403 filled in the trenches T1-Tm and the free layer 401 and optional buffer layer 402 lining on the sidewalls of the trenches T1-Tm but leave other portions of the second conductive material 403, the free layer 401 and optional buffer layer 402 remained in the Recesses 1-$p$ (only Recesses 1-6 are shown in FIG. 7A). More specifically, at this stage, the second conductive material 403, the free layer 401 and optional buffer layer 402 remained in one hollow are physically and electrically separated from the second conductive material 403, the free layer 401 and optional buffer layer 402 remained in another hollow. However, the second conductive material 403, the free layer 401 and optional buffer layer 402 remained in different Recesses within the same hollow such as in the Recesses 1 and 4 within the same hollow are still in one structure respectively. For example, the second conductive material 403 in the hollow comprising the Recesses 1 and 4 is in one structure and is rectangular ring-shaped (not shown in FIGS. 11-16). So are the free layer 401 and the optional buffer layer 402 (not shown in FIGS. 11-16). Then, a patterned mask such as a patterned photoresist layer is formed on the substrate to protect the second conductive material 403, the free layer 401 and the optional buffer layer 402 within the recesses and at least one etching is performed to remove the second conductive material 403, the free layer 401 and the optional buffer layer 402 within hollows in areas other than the Recesses. In other words, the second conductive material 403, free layer 401 and optional buffer layer 402 in each hollow that used to be in one structure respectively are sectionalized and become discrete parts. As a result, as shown in FIGS. 12, 14 and 16, the second conductive material 403, the free layer 401 and the optional buffer layer 402 in one recess are physically and electrically separated from the conductive material 403, the free layer 401 and the optional buffer layer 402 in another recess. The second conductive material 403 remained in the recesses such as Recesses 1-$p$ becomes a plurality of second electrodes such as second electrodes 4031-403$p$ (only second electrodes 4031-4036 are shown in FIG. 7A) embedded in the corresponding Recesses. It is noted that due to different layouts of FIGS. 11-12, FIGS. 13-14 and FIGS. 15-16 the shapes of the patterned masks used for FIGS. 11-12, FIGS. 13-14 and FIGS. 15-16 respectively are different. In the embodiment of FIGS. 11-12, portions of the second conductive material 403, the free layer 401 and the optional buffer layer 402 immediately adjacent to a through hole such as through hole H1 are preserved by using the patterned mask while portions of the second conductive material 403, the free layer 401 and the optional buffer layer 402 between through holes such as between through hole H1 and H4 are removed. Similarly for the embodiments of FIGS. 13-14 and FIGS. 15-16, portions of the second conductive material 403, the free layer 401 and the optional buffer layer 402 immediately adjacent to a through hole such as through hole H1' and H1" are preserved by using the patterned masks while portions of the second conductive material 403, the free layer 401 and the optional buffer layer 402 between through holes such as between through holes HP and H4' and between through holes H1" and H4" are removed. By doing so, a MTJ cell formed between one trench (one recess) and one through hole can be accessed independently. In the embodiment of FIGS. 11-12, one trench such as trench T1 is sandwiched by 6 through holes such as through holes H1, H2, H4, H5, H7 and H8, so each of the second conductive material 403, the free layer 401 and the optional buffer layer 402 within the same hollow is sectionalized into 6 sub-portions (only two sub-portions are shown in FIG. 12). Similarly, in the embodiment of FIGS. 13-14, one trench such as trench T1' is sandwiched by 2 through holes such as through holes HP and H2', so each of the second conductive material 403, the free layer 401 and the optional buffer layer 402 within the same hollow is sectionalized into 2 sub-portions as shown in FIG. 14. Also similarly, in the embodiment of FIGS. 15-16, one trench such as trench T1" is surrounded by 4 through holes such as through holes H1", H2", H4" and another through hole not shown in FIG. 16, so each of the second conductive material 403, the free layer 401 and the optional buffer layer 402 within the same hollow is sectionalized into 4 sub-portions as shown in FIG. 16.

Then referring to FIG. 8 and FIGS. 11-16, an insulating material 404 is formed in the trenches T1-Tm filling the trenches T1-Tm and filling spaces within the hollows without the second conductive material 403, the free layer 401 and the optional buffer layer 402. At least one planarization process such as a chemical mechanical polishing process is performed to remove excessive insulating material 404 resulting in a global planar surface across the substrate 100. Now the 3D MTJ array comprising a plurality of MTJ cells such as cells C1-Cp (will be discussed in detail later) according to the first embodiment of the present invention is finished. Similarly, the 3D MTJ arrays comprising a plurality of MTJ cells for the layouts of FIGS. 13-14 and FIGS. 15-16 are finished according to the first embodiment of the present invention. Further manufacturing processes for completing an integrated circuit can be performed such as forming interconnect for signal routing and voltage supplying, forming bonding pads and passivation layer for ensuing packaging work, etc. Each of the MTJ cells such as cells C1-Cp comprises portions of the tunnel layer 301, the fixed layer 302, the optional AFM layer 303, the optional buffer layer 304 and the first electrode 305 within one of the through holes such as through holes H1-Hn and portions of the free layer 401 and the optional buffer layer 402 and one second electrode embedded in one of the recesses such as Recesses 1-p. Each portion of the free layer 401 lining the inner surface of each of the recesses such as Recesses 1-p is referred to as a U-shaped free layer 401. Similarly, each portion of the buffer layer 402 lining the inner surface of each of the recesses is referred to as a U-shaped buffer layer 402. It is important to completely remove the second conductive material 403 in the trenches such as trenches T1-Tm within the second dielectric layers in order to physically separate the second electrodes within one first dielectric layer such as second electrodes 4033 and 4036 within the first dielectric layer 200a from the second electrodes within another first dielectric layer such as the second electrodes 4032 and 4035 within the first dielectric layer 200a'. Similarly, the free layer 401 and the optional buffer layer 402 in the trenches such as trenches T1-Tm within the second dielectric layers are also completely removed for the same reason. This could be seen in the top views of FIGS. 11, 13 and 15 which are taken along the level of the second dielectric layer 200b" showing lack of the free layer 401, the optional buffer layer 402 and the second conductive material 403.

Now the second embodiment of the present invention is discussed in conjunction with FIGS. 1, 2B, 3B, 4B, 5B, 6B, 7B and 8 and FIGS. 11-16. FIGS. 1, 2B, 3B, 4B, 5B, 6B, 7B and 8 are cross-sectional views taken along cutting line A-A' in the top views of FIGS. 11-16 illustrating a method for fabricating a 3D MTJ array according to the second embodiment of the present invention, wherein forming the second electrodes is performed before forming the first electrodes. FIGS. 11-12 are schematic top views of the 3D MTJ array taken along different horizontal levels in the FIG. 8 according to an embodiment of the present invention. FIG. 13-14 are schematic top views of the 3D MTJ array taken along different horizontal levels in the FIG. 8 according to another embodiment of the present invention. FIG. 15-16 are schematic top views of the 3D MTJ array taken along different horizontal levels in the FIG. 8 according to yet another embodiment of the present invention.

First referring to FIG. 1, similar to the first embodiment, a substrate 100 with an active surface 101 is provided and a plurality of bilayers 200', (200a, 200b), (200a', 200b') and (200a", 200b") are formed on the active surface 101. The details of the substrate 100 and the plurality of bilayers 200', (200a, 200b), (200a', 200b') and (200a", 200b") such as their materials and properties please refer to the first embodiment. Similarly, the present invention is not limited to iterations of the first dielectric layer and the second dielectric layer but comprises iterations of a film stack containing at least the first dielectric layer and the second dielectric layer.

Figure 2B:
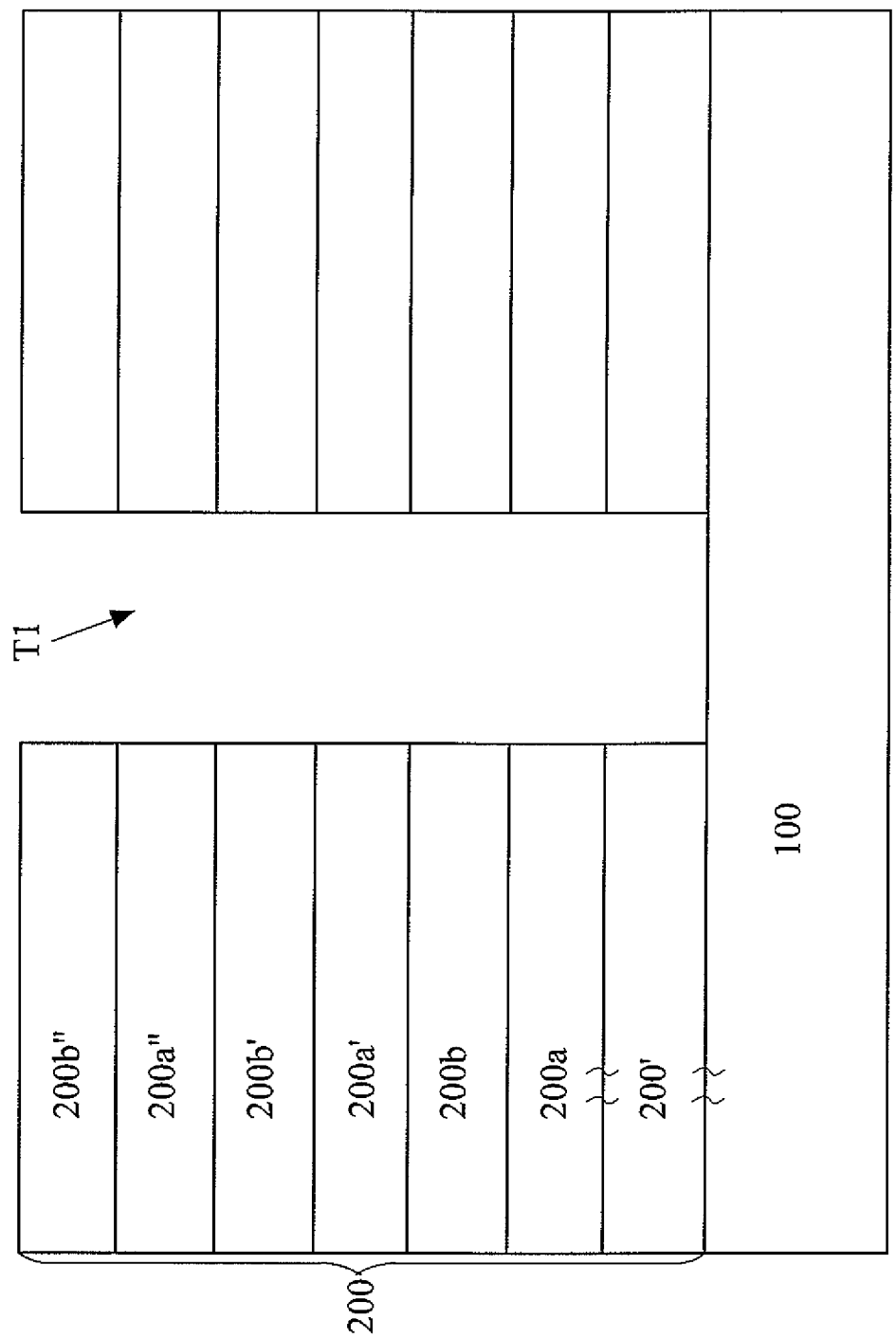

Next referring to FIG. 2B and FIG. 11, a plurality of trenches T1-Tm (only T1-T2 are shown in the partial layout top view of FIG. 11 and only one trench T1 is shown in FIG. 2B) are formed penetrating the bilayers 200', (200a, 200b), (200a', 200b') and (200a"+200b") and exposing the substrate 100 by at least a dry etching process especially an anisotropic dry etching process. The details of the plurality of trenches T1-Tm such as their shapes, sizes, quantity and arrangements please refer to the first embodiment.

Figure 3B:
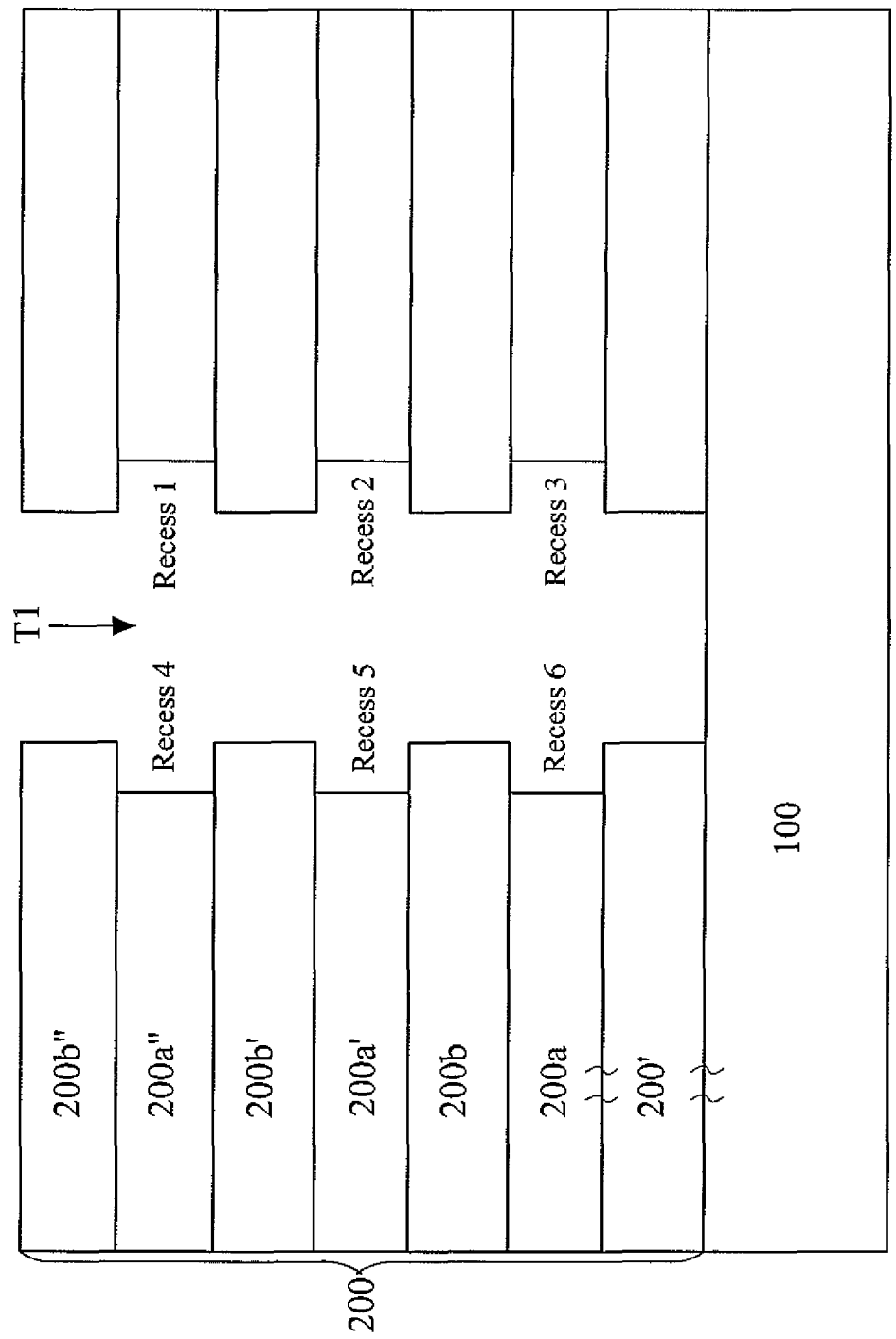

Then referring to FIG. 3B and FIG. 11, at least an isotropic etching especially a wet etching is performed to selectively remove portions of the first dielectric layers (200a, 200a' and 200a") through the trenches T1-Tm (only one trench T1 is shown in FIG. 3B). In a preferred embodiment, this wet etching has high etching rate toward the first dielectric layers and extremely low etching rate toward the second dielectric layers (200b, 200b' and 200b"). As a result shown in FIG. 3B, Recesses 1-p (only Recesses 1-6 are shown in FIG. 3B) are formed in regions that otherwise would have been occupied by the first dielectric layers surrounding the trenches T1-Tm. It is noted that compared to the first embodiment where the recesses are formed exposing (stopping on) different areas of a surface of the tunnel layer 301 lining the through hole H1, in this embodiment the recesses are formed by a controlled etching process such as a time-mode etching process. The horizontal depth of each recess should be carefully controlled in order to comply with the designed layout such as the partial layout top views shown in FIGS. 11, 13 and 15. The details of the Recesses 1-p such as their shapes, sizes and arrangement please refer to the first embodiment and FIGS. 11, 13 and 15.

Figure 4B:
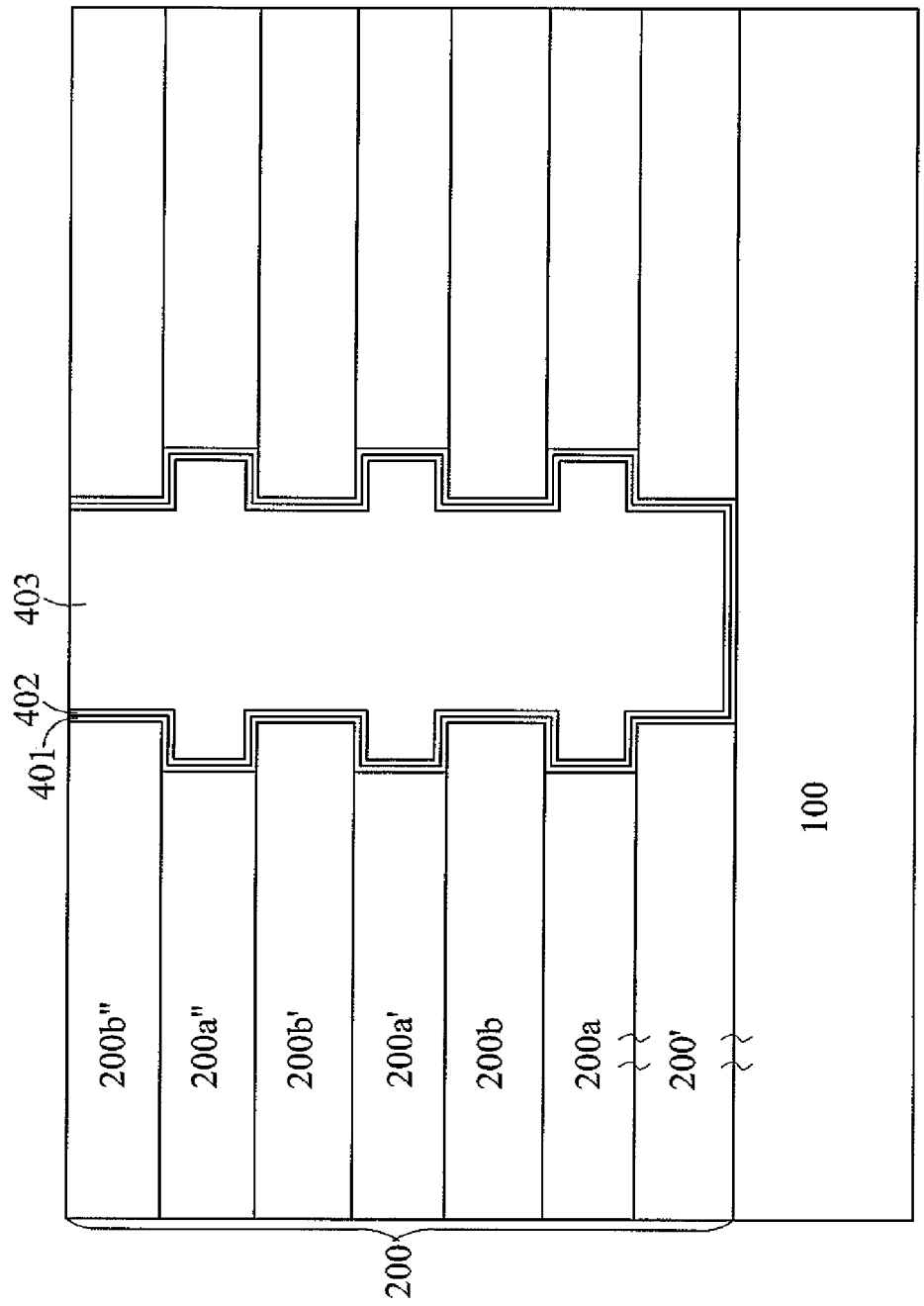

Next referring to FIG. 4B, a free layer 401 and an optional buffer layer 402 are formed in such order lining the inner surfaces of the trenches T1-Tm and the inner surfaces of the Recesses 1-p. Then, a second conductive material 403 is formed filling the trenches T1-Tm and the Recesses 1-p and at least one planarization process such as a chemical mechanical polishing process is performed to remove excessive free layer 401, optional buffer layer 402 and second conductive material 403 outside the trenches T1-Tm, thereby achieving a global planar surface across the substrate 100. That is, the polished upper surfaces of the free layer 401, optional buffer layer 402 and second conductive material 403 are substantially flush with the polished upper surface of the second dielectric layer 200b". The details of the free layer 401, optional buffer layer 402 and second conductive material 403 such as their materials, formations and properties please refer to the first embodiment.

Figure 5B:
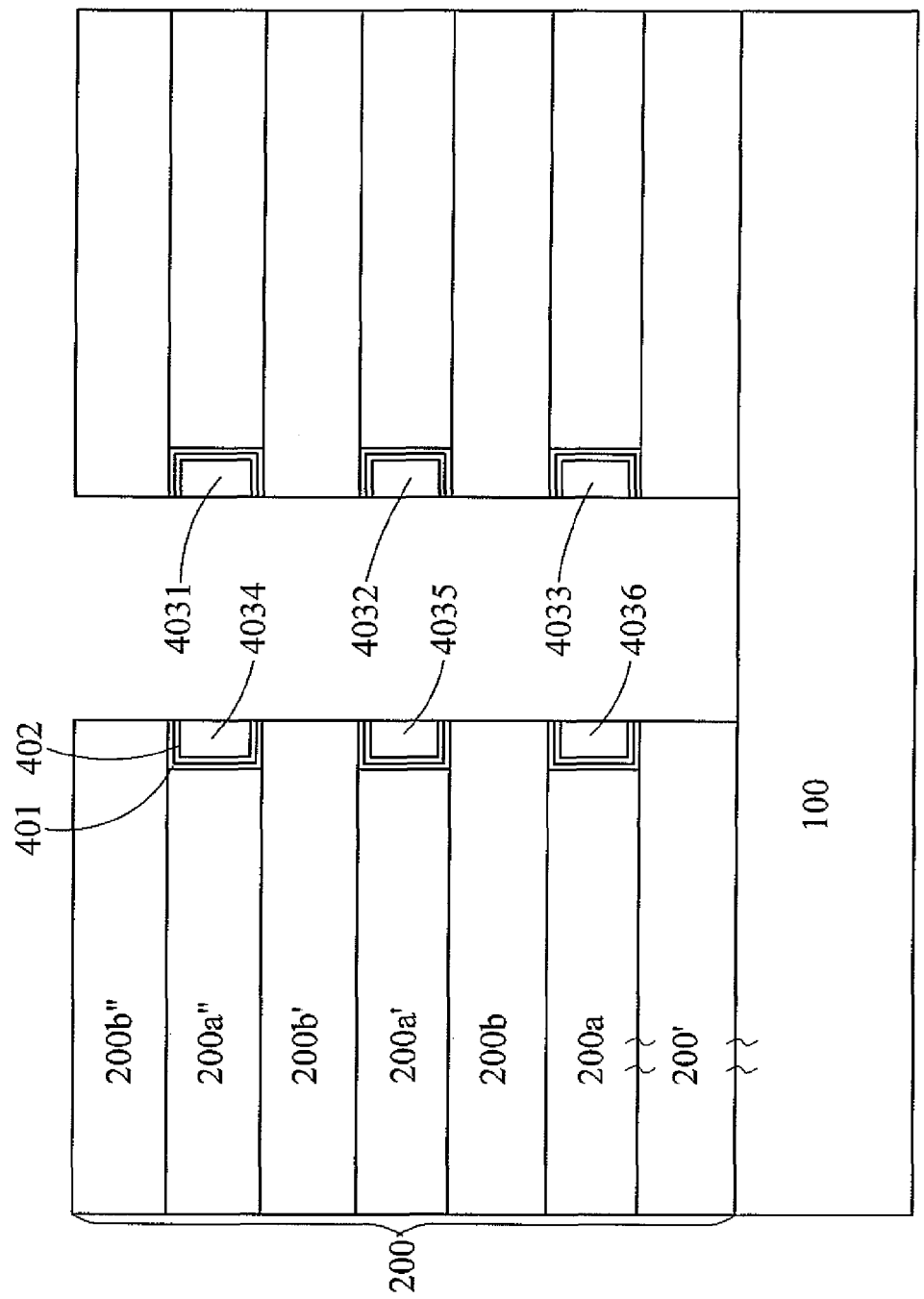

Then referring to FIG. 5B and FIGS. 11-16, at least one anisotropic etching is performed to remove portions of the second conductive material 403 filled in the trenches such as trenches T1-Tm and the free layer 401 and optional buffer layer 402 lining on the sidewalls of the trenches (only one trench T1 is shown in FIG. 5B) but leave other portions of the second conductive material 403, the free layer 401 and optional buffer layer 402 remained in the recesses such as Recesses 1-p (only Recesses 1-6 are shown in FIG. 5B). Then, a patterned mask such as a patterned photoresist layer is formed on the substrate to protect the second conductive material 403, the free layer 401 and the optional buffer layer 402 within the recesses and at least one etching is performed to remove the second conductive material 403, the free layer 401 and the optional buffer layer 402 within hollows in areas other than the Recesses. As a result, as shown in FIGS. 12, 14 and 16, the second conductive material 403, the free layer 401 and the optional buffer layer 402 in one recess are physically and electrically separated from the conductive material 403, the free layer 401 and the optional buffer layer 402 in another recess. In other words, the second conductive material 403, the free layer 401 and the optional buffer layer 402 in each hollow are sectionalized according to the pre-defined locations of recesses. The details of the arrangement of recesses and sectionalizations for different layouts of FIGS. 11-12, FIGS. 13-14 and FIGS. 15-16 please refer to the first embodiment.

Next referring to FIG. 6B and FIGS. 11-16, an insulating material 404 is formed in the trenches T1-Tm filling the trenches T1-Tm and filling spaces within the hollows without the second conductive material 403, the free layer 401 and the optional buffer layer 402. At least one planarization process such as a chemical mechanical polishing process is performed to remove excessive insulating material 404 resulting in a global planar surface across the substrate 100.

Next referring to FIG. 7B and FIGS. 11-16, a plurality of through holes H1-Hn (only H1-H9 are shown in the partial layout top view of FIG. 11 and only H1 and H2 are shown in the partial cross-sectional view of FIG. 7B) are formed penetrating the bilayers 200', (200a, 200b), (200a', 200b') and (200a"+200b") and exposing the substrate 100 by at least a dry etching process especially an anisotropic dry etching process. It is important that the through holes H1-Hn are formed adjacent the recesses exposing areas of a surface of the free layer 401 lining the vertical sides of the recesses. This can be done with precise lithography alignment and/or enlarging the through holes H1-Hn additionally after their formations. The geometries of the through holes H1-Hn please refer to the first embodiment. The details of the arrangement of the through holes with respect to the trenches and geometries of the through holes H1-Hn please refer to the first embodiment and different layouts of FIGS. 11-12, FIGS. 13-14 and FIGS. 15-16.

Then referring to FIG. 8 and FIGS. 11-16, a tunnel layer 301, a fixed layer 302, an optional antiferromagnetic layer (AFM layer) 303 and an optional buffer layer 304 are formed in such order lining the through holes H1-Hn. Next, a first conductive material is formed filling the through holes H1-Hn and at least one planarization process such as a chemical mechanical polishing process is performed to remove excessive tunnel layer 301, fixed layer 302, optional AFM layer 303, optional buffer layer 304 and the first conductive material outside the through holes H1-Hn, thereby achieving a global planar surface across the substrate 100 and patterned first electrodes 305 filled in the through holes H1-Hn. Now the 3D MTJ array comprising a plurality of MTJ cells such as MTJ cells C1-Cp (will be discussed in detail later) according to the second embodiment of the present invention is finished. Similarly, the 3D MTJ arrays comprising a plurality of MTJ cells for the layouts of FIGS. 13-14 and FIGS. 15-16 are finished according to the second embodiment of the present invention. Further manufacturing processes for completing an integrated circuit can be performed such as forming interconnect for signal routing and voltage supplying, forming bonding pads and passivation layer for ensuing packaging work, etc. The details of the tunnel layer 301, fixed layer 302, optional AFM layer 303, optional buffer layer 304 and the first conductive material such as their materials and properties please refer to the first embodiment.

The 3D MTJ arrays comprising a plurality of MTJ cells such as cells C1-Cp of the present invention may be fabricated according to either the first embodiment of the present invention where the through holes such as through holes H1-Hn are formed before forming the trenches such as trenches T1-Tm or the second embodiment of the present invention where the trenches are formed before forming the through holes. For both the first and second embodiments, the tunnel layer 301 lining a through hole should be in physical contact with the free layer 401 lining the recesses protruding from an inner surface of a trench corresponding to said through hole (usually immediately adjacent to said through hole). In order to ensure the physical contact between the tunnel layer 301 and the free layer 401, in the first embodiment the recesses are etched using the tunnel layer 301 as an etching stop layer probably with a certain degree of overetching. Furthermore, although FIGS. 11-12, FIGS. 13-14 and FIGS. 15-16 show top views of different layouts, their cross-sectional views taken along the cutting lines A-A' are the same and they can both be fabricated according to the first and second embodiments.

Figure 9:
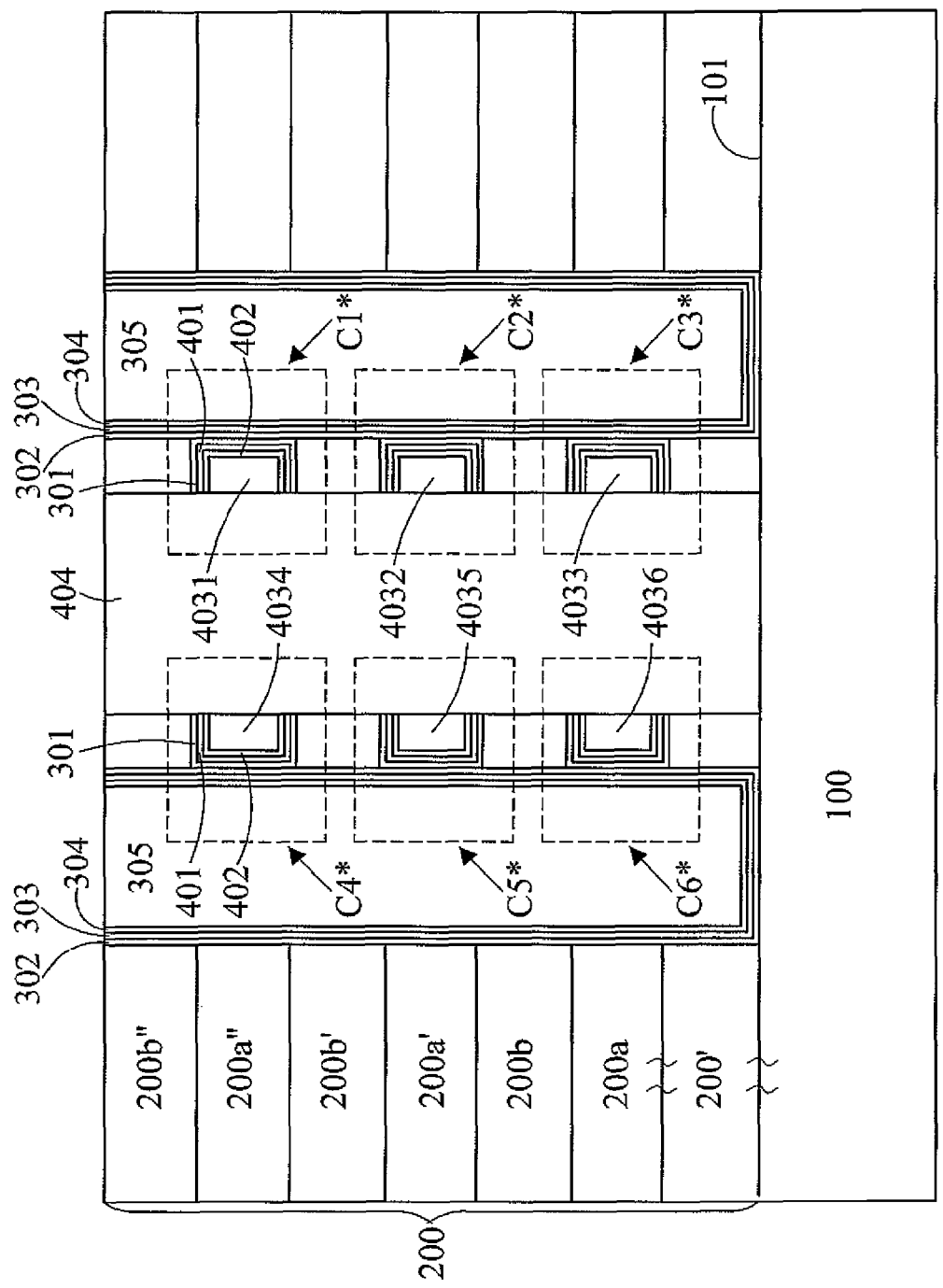
FIG. 9 is a cross-sectional view of another 3D MTJ array formed by a method for fabricating a 3D MTJ array according to the third embodiment of the present invention, wherein the tunnel layer is formed in the trenches instead of the through holes.

Now the third embodiment of the present invention is discussed in conjunction with the first embodiment, the second embodiment and FIG. 9. FIG. 9 is a cross-sectional view of another 3D MTJ array formed by a method for fabricating a 3D MTJ array according to the third embodiment of the present invention, wherein the tunnel layer is formed in the trenches instead of the through holes.

First, the third embodiment is discussed in conjunction with the first embodiment (FIGS. 1, 2A, 3A, 4A, 5A, 6A, 7A). Now referring to FIGS. 1 and 9, a substrate 100 with an active surface 101 is provided and a plurality of bilayers 200', (200a, 200b), (200a', 200b') and (200a", 200b") are formed on the active surface 101. Then referring to FIGS. 2A, 9 and 11-16, a plurality of through holes H1-Hn (only H1 and H2 are shown in the partial cross-sectional view of FIGS. 2A and 9; FIGS. 11-16 provide more detailed layouts) are formed penetrating the bilayers 200', (200a, 200b), (200a', 200b') and (200a"+200b") and exposing the substrate 100 by at least a dry etching process. Then referring to FIGS. 3A and 9, a fixed layer 302, an optional antiferromagnetic layer (AFM layer) 303 and an optional buffer layer 304 are formed in such order lining the through holes H1-Hn and a first conductive material is formed filling the through holes H1-Hn. At least one planarization process such as a chemical mechanical polishing process is performed to remove excessive fixed layer 302, optional AFM layer 303, optional buffer layer 304 and the first conductive material outside the through holes H1-Hn, thereby achieving a global planar surface across the substrate 100 and patterned first electrodes 305 filled in the through holes H1-Hn. It is noted that a major difference between the first embodiment (FIG. 3A) and the third embodiment (FIG. 9) at this stage lies in the formation of the tunnel layer 301. The tunnel layer 301 is formed in the through holes H1-Hn in the first embodiment while absent in the through holes H1-Hn in the third embodiment. Then referring to FIGS. 4A, 9 and 11-16, a plurality of trenches T1-Tm (only one trench T1 is shown in FIGS. 4A and 9; FIGS. 11-16 provide more detailed layouts) are formed adjacent to the through holes, penetrating the bilayers 200', (200a, 200b), (200a', 200b') and (200a"+200b") and exposing the substrate 100 by at least a dry etching process. Next referring to FIGS. 5A, 9 and 11-16, at least an isotropic etching especially a wet etching is performed to selectively remove portions of the first dielectric layers (200a, 200a' and 200a") through the trenches T1-Tm, thereby forming Recesses 1-*p* (only Recesses 1-6 are shown in FIGS. 5A and 9) in regions that otherwise would have been occupied by the first dielectric layers surrounding the trenches T1-Tm. Then referring to FIGS. 6A and 9, a tunnel layer 301, a free layer 401 and an optional buffer layer 402 are formed in such order lining the inner surfaces of the trenches T1-Tm and the inner surfaces of the Recesses 1-*p*, and a second conductive material 403 is formed filling the trenches T1-Tm and the Recesses 1-*p*. At least one planarization process such as a chemical mechanical polishing process is performed to remove excessive tunnel layer 301, free layer 401, optional buffer layer 402 and the second conductive material 403 outside the trenches T1-Tm, thereby achieving a global planar surface across the substrate 100. It is noted that another major difference between the first embodiment (FIG. 6A) and the third embodiment (FIG. 9) at this stage lies in the formation of the tunnel layer 301. The tunnel layer 301 isn't formed in the trenches T1-Tm in the first embodiment but is formed in the trenches T1-Tm in the third embodiment. Next referring to FIGS. 7A, 9 and 11-16, at least one anisotropic etching is performed to remove portions of the second conductive material 403 filled in the trenches T1-Tm and the tunnel layer 301, the free layer 401 and optional buffer layer 402 lining on the sidewalls of the trenches T1-Tm but leave other portions of the second conductive material 403, the tunnel layer 301, the free layer 401 and optional buffer layer 402 remained in the Recesses 1-p (only Recesses 1-6 are shown in FIG. 7A). Since the tunnel layer 301 is made by at least one insulating material, at this stage it may be optionally removed. That is, the tunnel layer 301 may remain on the sidewalls of the trenches T1-Tm (not shown). A patterned mask such as a patterned photoresist layer is formed on the substrate to protect the second conductive material 403, the tunnel layer 301, the free layer 401 and the optional buffer layer 402 within the recesses and at least one etching is performed to remove the second conductive material 403, the tunnel layer 301, the free layer 401 and the optional buffer layer 402 within hollows in areas other than the recesses. Then referring to FIGS. 9 and 11-16, an insulating material 404 is formed in the trenches T1-Tm filling the trenches T1-Tm and filling spaces within the hollows without the second conductive material 403, the tunnel layer 301, the free layer 401 and the optional buffer layer 402. At least one planarization process such as a chemical mechanical polishing process is performed to remove excessive insulating material 404 resulting in a global planar surface across the substrate 100. Now the 3D MTJ array comprising a plurality of MTJ cells such as C1*-Cp* shown in FIG. 9 according to the third embodiment of the present invention is finished. Except for the formation and removal of the tunnel layer 301, all the details discussed in conjunction with the first embodiment may be applied to this third embodiment. Due to the changes made to the tunnel layer 301, each of the MTJ cells such as C1*-Cp* shown in FIG. 9 would have a U-shaped tunnel layer 301.

Similarly, the 3D MTJ array comprising a plurality of MTJ cells such as C1*-Cp* shown in FIG. 9 according to the third embodiment of the present invention may be fabricated following the method of the second embodiment (FIGS. 1, 2B, 3B, 4B, 5B, 6B, 7B). The differences between the third embodiment (FIG. 9) and the second embodiment are also the formation and removal of the tunnel layer 301. Specifically, in order to fabricate the third embodiment, the following changes are made to the second embodiment: at the stage of FIG. 4B the tunnel layer 301 is formed before the free layer 401 and the optional buffer layer 402 lining the inner surfaces of the trenches T1-Tm and the inner surfaces of the Recesses 1-p and is planarized; at the stage of FIG. 5B the tunnel layer 301 on the sidewalls of the trenches T1-Tm may be removed or it may be remained on the sidewalls of the trenches T1-Tm and portions of the tunnel layer 301 in the hollows not protected by the patterned mask are removed; and at the final stage of FIG. 9 no tunnel layer 301 is formed in the through holes H1-Hn. Except for the formation and removal of the tunnel layer 301, all the details discussed in conjunction with the first or second embodiments may be applied to this third embodiment.

Figure 8:
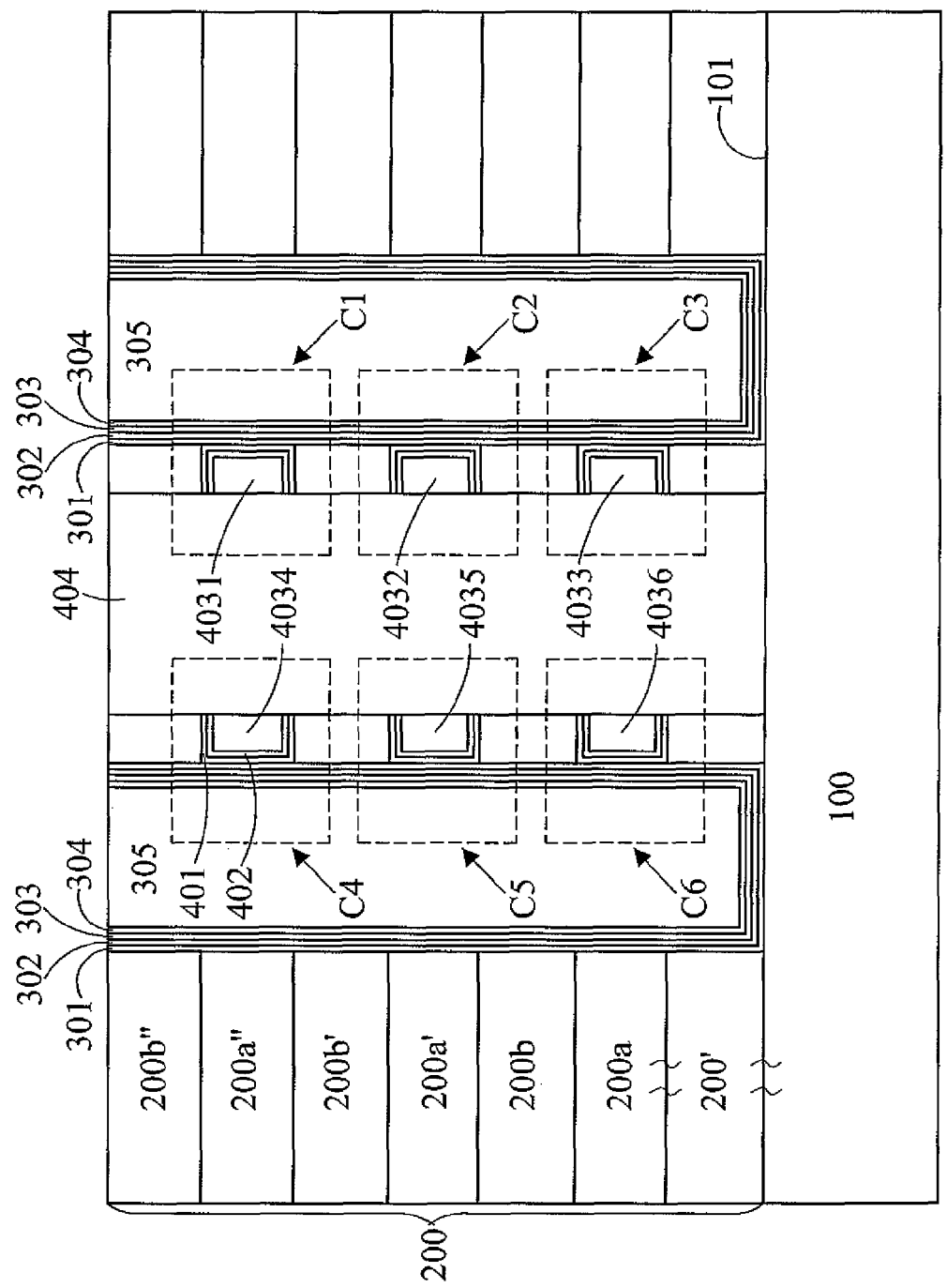
Figure 10:
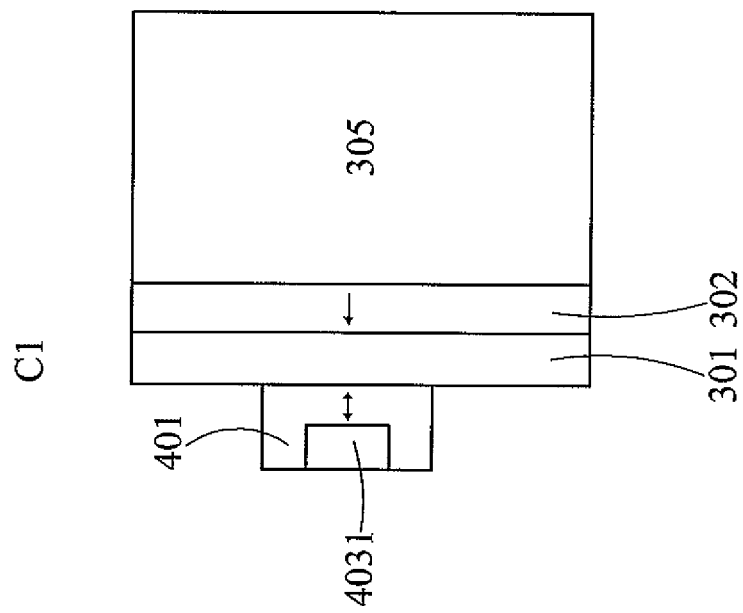
FIG. 10 is a schematic cross-sectional view of one magnetic tunnel junction cell (MTJ cell) of the 3D MTJ array shown in FIG. 8 according to an embodiment of the present invention.

Now the MTJ cell and the 3D MTJ array comprising a plurality of MTJ cells according to an embodiment of the present invention are discussed in conjunction with FIGS. 8, 10 and 11-16. FIG. 8 is a cross-sectional view of a 3D MTJ array according to an embodiment of the present invention. FIG. 10 is a schematic cross-sectional view of one MTJ cell of the 3D MTJ array shown in FIG. 8 according to an embodiment of the present invention. FIGS. 11-16 are top views of the 3D MTJ array taken along different horizontal levels in the FIG. 8 according to different embodiments of the present invention.

Referring to FIGS. 8 and 11-16, a substrate 100 of single-crystal semiconductor material such as a single-crystal Si substrate 100 is provided. In various embodiments, the substrate 100 may be a silicon-on-insulation (SOI) wafer or a partially fabricated wafer during any of many stages of integrated circuit fabrication thereon. The substrate 100 has an active surface 101 such as a front surface with various active devices and/or passive devices formed thereon and extends in a horizontal direction. The substrate 100 typically has a diameter of 200 mm, 300 mm, 450 mm or larger. However, the present invention is not limited thereto. The substrate 100 may be of various shapes, materials and/or sizes other than what's listed above. A plurality of bilayers 200', (200a, 200b), (200a'+200b') and (200a"+200b") are disposed on the active surface 101. The details of the plurality of bilayers 200', (200a, 200b), (200a', 200b') and (200a", 200b") such as their materials and properties please refer to the first and second embodiments. The 3D MTJ array of the present invention is provided within the plurality of bilayers 200', (200a, 200b), (200a'+200b') and (200a"+ 200b"). The 3D MTJ array of the present invention includes a tunnel layer 301, a fixed layer 302, an optional AFM layer 303 and an optional buffer layer 304 lining each one of the through holes H1-Hn and a first electrode 305 filled in each one of the through holes H1-Hn (only two through holes H1 and H2 are shown in FIG. 7, only eight through holes H1-H8 are shown in FIG. 9 and only nine through holes H1'-H9' are shown in FIG. 11). Due to the shape and orientation of the through holes H1-Hn as discussed earlier, each first electrode 305 may be rectangular-shaped and has its axis extending in a direction substantially perpendicular to the active surface 101 of the substrate 100. Since there are n through holes, there are n first electrodes. The details of the tunnel layer 301, the fixed layer 302, the optional AFM layer 303, the optional buffer layer 304 and the first electrode 305 such as their materials, formations and properties please refer to the first and second embodiments.

Referring to FIG. 8, the 3D MTJ array of the present invention further includes a U-shaped free layer 401 and a U-shaped optional buffer layer 402 lining the inner surface of each of the Recesses 1-p and a second electrode such as the second electrode 4031 embedded in each of the Recesses 1-p (only 6 recesses are shown in FIG. 8). As discussed earlier, the Recesses 1-p are formed by removing portions of the first dielectric layers 200a, 200a' and 200a" through the trenches, so the Recesses 1-p within the first dielectric layers protrude from the trenches toward the through holes and are separated vertically by the second dielectric layers 200b, 200b' and 200b". Therefore, the second electrodes embedded in the Recesses 1-p are disposed within the first dielectric layers and separated vertically by the second dielectric layers.

Furthermore, as discussed earlier and may be seen from FIG. 8 and FIGS. 12, 14 and 16, the second conductive material 403, the free layer 401 and the optional buffer layer 402 in each hollow are sectionalized according to the pre-defined locations of recesses (one recess is formed between one trench and one through hole). Therefore, the second conductive material 403, the free layer 401 and the optional buffer layer 402 in one recess are physically and electrically separated from the conductive material 403, the free layer 401 and the optional buffer layer 402 in another recess. The quantity of the recesses and the second electrodes depends on the layout of through holes and trenches as explained in conjunction with the first embodiment.

Referring to FIG. 8, a first electrode 305, a second electrode such as the second electrode 4031 embedded in the Recess 1, a tunnel layer 301, a fixed layer 302 and a U-shaped free layer 401 sandwiched between the first electrode 305 and the second electrode constitute a MTJ cell such as the MTJ cell C1 shown in FIG. 8. The 3D MTJ array of the present invention comprises a plurality of MJT cells such as cells C1-C6 shown in FIG. 8 arranged not only horizontally across the substrate 100 but also vertically stacked along the first electrodes 305. Generally, each first electrode 305 can be electrically accessed independently and each second electrode such as the second electrode 4031 can be electrically accessed independently or can be electrically accessed together with the second electrodes surrounding/adjacent to the same trench such as the second electrode 4034 can be electrically accessed together with the second electrodes within the same first dielectric layer. In either case, electrically selecting one first electrode such as the first electrode 305 in T1 and one second electrode such as the second electrode 4031 embedded in Recess 1 would lead to electrically accessing a single MTJ cell such as the MTJ cell C1. Therefore, through a write or read operation one can write or read a MTJ cell of the 3D MTJ array of the present invention. Alternatively, any layer that is conductive or semiconductive within the MTJ cell according to an embodiment of the present invention may be electrically accessed either together with other MTJ cell or independently, thereby making said MTJ cell a multi-terminal device such as a three-terminal device. The same principles of MTJ cell and array explained above or in the following paragraphs may be applied to the 3D MTJ array shown in FIG. 9.

Referring to FIG. 10, a simplified MTJ cell C1 of the present invention is provided to explain various kinds of MTJ cells and their potential operation modes. The simplified MTJ cell C1 comprises: a first electrode 305 having an axis extending in a direction substantially perpendicular to the active surface 101 of the substrate 100 (substrate 100 and active surface 101 are not shown in FIG. 10); a second electrode 4031 embedded in a U-shaped free layer 401 (hence embedded in the corresponding Recess 1); a fixed layer 302, a tunnel layer 301 and the U-shaped free layer 401 sandwiched between the first electrode 305 and the second electrode 4031. The U-shaped free layer 401 has a vertical portion (the portion with an arrow in FIG. 10) substantially perpendicular to the active surface 101 of the substrate 100. In a case where the directions of the magnetizations of the fixed layer 302 and the vertical portion of the U-shaped free layer 401 shown as arrows in FIG. 10 are substantially perpendicular to the thicknesses of the layer 302 and the vertical portion of layer 401 (substantially perpendicular to the axis of the first electrode 305 and parallel to the active surface 101), the simplified MTJ cell C1 has out-of-plane magnetizations of the fixed layer and the free layer. In such a case, the long side of the rectangular second electrode 4031 should be in a direction substantially perpendicular to active surface 101, so the vertical portion of the U-shaped free layer 401 can have a larger contact area with the tunnel layer 301 and the direction of the magnetization of the entire U-shaped free layer 401 can be dominated by the portion in contact with the tunnel layer 301 (dominated by the vertical portion). Alternatively, the simplified MTJ cell C1 may have in-plane magnetizations of the fixed layer 302 and the free layer 401. In such a case, the directions of the magnetizations of the fixed layer 302 and the vertical portion of the U-shaped free layer 401 are substantially parallel to the thickness (substantially parallel to the axis of the first electrode 305 and perpendicular to the active surface 101). In either out-of-plane or in-plane type MTJ cell C1, the MTJ cell C1 have two possible states: the directions of the magnetizations of the fixed layer 302 and the U-shaped free layer 401 are the same (both pointing left in the out-of-plane type as shown in FIG. 10) and such state is referred to as parallel state; or the directions of the magnetizations of the fixed layer 302 and the U-shaped free layer 401 are opposite (fixed layer 302 pointing left while free layer 401 pointing right in the out-of-plane type as shown in FIG. 10) and such state is referred to as antiparallel state. One of these two states has a lower electrical resistance while the other one of these two states has a much higher electrical resistance. The state of the MTJ cell C1 is readable by applying electrical current through the first electrode 305 and the second electrode 401. That is, each MTJ cell of the 3D MTJ array of the present invention is readable individually and separately by applying electrical current through a corresponding first electrode 305 and a corresponding second electrode.

To achieve the two states, different magnetization switching mechanisms may be chosen. The first mechanism traditionally would make electrical current pass the second electrode 4031 to create an external magnetic field in order to change the direction of the magnetization of the free layer 401. The fixed layer 302 usually has a larger switching field so its direction of the magnetization cannot be changed easily by an applied external magnetic field and tends to always point the same direction. On the other hand, the free layer 401 has a smaller switching field so its direction of the magnetization is free to point either the same direction as the fixed layer 302 or the opposite direction to the fixed layer 302 depending on the applied external magnetic field. The second mechanism would make electrical currents of opposite directions pass the first electrode 305 and the second electrode 401 to change the direction of the magnetization of the free layer 401 via Spin Torque Transfer (STT) effect. Alternatively, one could apply positive or negative voltages across the first electrode 305 and the second electrode 4031 to change the direction of the magnetization of the free layer 401 via Voltage-Controlled Magnetic Anisotropy (VCMA) method. Alternatively, one could make electrical current pass the second electrode 4031 to change the direction of the magnetization of the free layer 401 via Spin-Orbit Torque (SOT) effect or Spin-Hall Effect (SHE) or Rashba Effect. Other effect such as giant spin Hall effect (GSHE) may be adopted.

The first electrode and the second electrode (and other terminal(s) if any) of the MTJ cell of the present invention may be eventually electrically connected to a word line and a bit line (and other operational voltage or device if deemed appropriate). Therefore, the 3-D MTJ array of the present invention integrated with a suitable routing system and an optimized circuit design may be applied to a magnetic random access memory (MRAM) of various configurations such as a one transistor-one MTJ (1T1M) configuration, one transistor-two MTJs (1T2M configuration, etc. A MRAM adopting the 3-D MTJ array of the present invention would benefit from vertical cell stacking and compact through hole and trench layout and achieve a higher storage density with a smaller chip size. It can also be configured to form logic gates of different functions, such as AND, OR, NOR NAND, etc., and applied in logic circuitry.

The simplified MTJ cell C1 shows the fundamental structure of a MTJ cell. However, the MTJ cell of the present invention may adopt various kinds of film stacks feasible under the tunnel magnetoresistance effect. For example, extra layers such as a seed layer and/or a barrier layer may be added to the film stack. For example, the free layer 401 may be replaced by two ferromagnetic films separated by a spacer layer therebetween. For example, the fixed layer 302 may exist alone without the assistance of the optional AFM layer 303. The present invention create a high density 3D MTJ array by vertically stacking the MTJ cells along a direction substantially perpendicular to the substrate surface and designing a beneficial trench-through hole layout.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device comprising:
   a first electrode having an axis extending in a direction substantially perpendicular to an active surface of a substrate;
   a fixed layer, a U-shaped free layer and a tunnel layer sandwiched between the fixed layer and the U-shaped free layer;
   a second electrode embedded in the U-shaped free layer,
   wherein the fixed layer, the tunnel layer and the U-shaped free layer are disposed between the first electrode and the second electrode and constitute a magnetic tunnel junction.

2. The electronic device of claim 1, wherein the magnetic tunnel junction has a state changeable individually and separately by a magnetization switching mechanism.

3. The electronic device of claim 1, further comprising:
   a through hole on the substrate, wherein an inner surface of the through hole is lined with the fixed layer and the tunnel layer and the through hole is filled with the first electrode.

4. The electronic device of claim 3, further comprising:
   a trench substantially perpendicular to the active surface; and
   a recess protruding from the trench with the U-shaped free layer lining an inner surface of the recess and the second electrode embedded in the U-shaped free layer.

5. The electronic device of claim 4, further comprising:
   another recess protruding from the trench along a different horizontal level from a horizontal level of the recess;
   another U-shaped free layer lining an inner surface of the another recess; and
   another second electrode embedded in the another U-shaped free layer,
   wherein the fixed layer, the tunnel layer, the U-shaped free layer and the another U-shaped free layer constitute a plurality of magnetic tunnel junctions stacked vertically.

6. The electronic device of claim 5, each one of the plurality of magnetic tunnel junctions has a state readable individually and separately by applying an electrical current through the first electrode and a corresponding second electrode.

7. The electronic device of claim 4, further comprising:
   another through hole on the substrate,
   wherein the through hole and the another through hole are disposed at opposite sides of the trench in top view.

8. The electronic device of claim 1, further comprising:
   an antiferromagnetic layer and a buffer layer disposed between the fixed layer and the first electrode.

9. A three-dimensional magnetic tunnel junction array comprising:
   a first electrode having an axis extending in a direction substantially perpendicular to an active surface of a substrate;
   a first portion of a fixed layer, a first free layer, a first portion of a tunnel layer sandwiched between the first portion of the fixed layer and the first free layer, and a first portion of a second electrode, wherein the first portion of the fixed layer, the first portion of the tunnel layer and the first free layer disposed between the first electrode and the first portion of the second electrode constitute a first magnetic tunnel junction;
   a second portion of the fixed layer, a second free layer, a second portion of the tunnel layer sandwiched between the second portion of the fixed layer and the second free layer, and a second portion of the second electrode, wherein the second portion of the fixed layer, the second portion of the tunnel layer and the second free layer disposed between the first electrode and the second portion of the second electrode constitute a second magnetic tunnel junction,
   wherein the first magnetic tunnel junction and the second magnetic tunnel junction are stacked vertically along the first electrode.

10. The three-dimensional magnetic tunnel junction array of claim 9, wherein each one of the first and second magnetic tunnel junctions has a state readable individually and separately by applying an electrical current through the first electrode and a corresponding second electrode.

11. The three-dimensional magnetic tunnel junction array of claim 9, wherein the first free layer and the second free layer are U-shaped and the first portion of the second electrode and the second portion of the second electrode are embedded in the U-shaped first free layer and the U-shaped second free layer respectively.

12. The three-dimensional magnetic tunnel junction array of claim 9, further comprising:
   a through hole on the substrate, wherein an inner surface of the through hole is lined with the fixed layer and the tunnel layer and the through hole is filled with the first electrode.

13. The three-dimensional magnetic tunnel junction array of claim 9, further comprising:
   a trench on the substrate; and
   a first recess and a second recess protruding from the trench along different horizontal levels,
   wherein the first free layer is U-shaped and lines an inner surface of the first recess,
   wherein the second free layer is U-shaped and lines an inner surface of the second recess.

* * * * *